United States Patent
Botez et al.

(10) Patent No.: US 9,742,151 B1
(45) Date of Patent: Aug. 22, 2017

(54) TERAHERTZ QUANTUM CASCADE LASERS

(71) Applicant: Wisconsin Alumni Research Foundation, Madison, WI (US)

(72) Inventors: Dan Botez, Madison, WI (US); Christopher A. Sigler, Madison, WI (US); Thomas L. Earles, Verona, WI (US); Jeremy D. Kirch, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/145,951

(22) Filed: May 4, 2016

(51) Int. Cl.
*H01S 5/12* (2006.01)
*H01S 5/34* (2006.01)
(Continued)

(52) U.S. Cl.
CPC .......... *H01S 5/12* (2013.01); *H01S 5/0287* (2013.01); *H01S 5/3402* (2013.01); *H01S 5/34313* (2013.01)

(58) Field of Classification Search
CPC ...... H01S 5/12; H01S 5/34313; H01S 5/0287; H01S 5/3402
See application file for complete search history.

(56) References Cited

U.S. PATENT DOCUMENTS

| | | | |
|---|---|---|---|
| 5,926,493 A * | 7/1999 | O'Brien | B82Y 20/00 372/50.11 |
| 6,175,581 B1 * | 1/2001 | Sato | H01S 5/12 372/50.11 |

(Continued)

FOREIGN PATENT DOCUMENTS

WO    WO2014/018599 A1    1/2014

OTHER PUBLICATIONS

Vijayraghavan, K., et al., Broadly tunable terahertz generation in mid-infrared quantum cascade lasers, Nature Communications 4, Article No. 2021: doi:10,1038/ncomms3021, Jun. 17, 2013, pp. 1-7.
Botez, D., et al., Temperature sensitivity of the electro-optical characteristics for mid-infrared ($\lambda$=3-16 μm)-emitting quantum cascade lasers, J. Phys. D: Appl. Phys. 49 (2016) 043001: doi:10.1088/0022-3727/49/4/043001, Dec. 15, 2015, pp. 1-33.
Kirch, J., et al., Highly temperature insensitive, low threshold-current density ($\lambda$=8.7-8.8μm) quantum cascade lasers, Appl. Phys. Lett. 106, 151106 (2015); doi.org/10.1063/1.4917499, Apr. 15, 2015, pp. 151106-1-151106-5.

(Continued)

*Primary Examiner* — Xinning Niu
(74) *Attorney, Agent, or Firm* — Bell & Manning, LLC

(57) ABSTRACT

A terahertz quantum cascade laser device is provided comprising a substrate having a top substrate surface, a bottom substrate surface, and an exit facet extending between the top substrate surface and the bottom substrate surface at an angle $\theta_{tap}$. The device comprises a waveguide structure having a top surface, a bottom surface, a front facet extending between the top surface and the bottom surface and positioned proximate to the exit facet, and a back facet extending between the top surface and the bottom surface and oppositely facing the front facet. The waveguide structure comprises a quantum cascade laser structure configured to generate light comprising light of a first frequency $\omega_1$, light of a second frequency $\omega_2$, and light of a third frequency $\omega_{THz}$, wherein $\omega_{THz} = \omega_1 - \omega_2$; an upper cladding layer; and a lower cladding layer. The device comprises a distributed feedback grating layer configured to provide optical feedback for one or both of the light of the first frequency $\omega_1$ and the light of the second frequency $\omega_2$ and to produce lasing at one or both of the first frequency $\omega_1$ and the second frequency $\omega_2$, thereby resulting in laser emission at the third frequency $\omega_{THz}$ at a Cherenkov angle $\theta_{THz}$ through the bottom surface of the waveguide structure into the substrate and exiting the substrate through the exit facet. The device comprises a high-reflectivity coating on the front facet of the waveguide structure.

20 Claims, 21 Drawing Sheets

(51) Int. Cl.
   *H01S 5/028*    (2006.01)
   *H01S 5/343*    (2006.01)

(56) References Cited

U.S. PATENT DOCUMENTS

| | | | |
|---|---|---|---|
| 7,974,325 B2 | 7/2011 | Belkin et al. | |
| 8,259,767 B2 | 9/2012 | Botez et al. | |
| 8,428,093 B2 | 4/2013 | Botez et al. | |
| 9,509,123 B2 * | 11/2016 | Belkin | H01S 5/1096 |
| 2012/0230358 A1 * | 9/2012 | Botez | B82Y 20/00 |
| | | | 372/45.01 |

OTHER PUBLICATIONS

Gowen, A., et al., Terahertz time domain spectroscopy and imaging: Emerging techniques for food process monitoring and quality control, Trends in Food Science & Technology, vol. 25, Issue 1, May 2012, pp. 40-46.

Hidaka, T. and Hatano, Y., Simultaneous Two Wave Oscillation LD Using Biperiodic Binary Grating, Electronics Letters, vol. 27 No. 12, Jun. 6, 1991, pp. 1075-1076.

Meng, B., et al., Broadly continuously tunable slot waveguide quantum cascade lasers based on a continuum-to-continuum active region design, Applied Physics Letters 107, 111110 (2015); doi:10.1063/1.4931444, Sep. 18, 2015, pp. 111110-1-111110-5.

* cited by examiner

Uncoated Front Facet/Uncoated Back Facet Biperiodic Binary Grating Region

TERAHERTZ QUANTUM CASCADE LASERS

REFERENCE TO GOVERNMENT RIGHTS

This invention was made with government support under W911NF-15-P-0020 awarded by the US Army/ARO. The government has certain rights in the invention.

BACKGROUND

The concept of terahertz (THz) sources based on intra-cavity difference-frequency generation (DFG) in dual-wavelength mid-infrared (IR) quantum cascade lasers (QCLs) was proposed and experimentally demonstrated by Belkin et al. (See M. A. Belkin, et al., Nature Photon. 1, 288-292 (2007).) Room-temperature operation of these devices (called THz DFG-QCLs) followed. (See M. A. Belkin, et al., Appl. Phys. Lett. 92, 201101 (2008).) The active region in THz DFG-QCLs is quantum-engineered so as to produce both broadband mid-IR gain and giant intersubband nonlinearity for THz DFG. Upon application of a bias voltage, lasing commences at two mid-IR frequencies $\omega_1$ and $\omega_2$ and the THz output at $\omega_{THz}=\omega_1-\omega_2$ is produced by DFG between the mid-IR beams in the same monolithic laser cavity. From a user perspective, these devices are similar in their production costs and operating simplicity to mid-IR QCLs.

The key figure of merit for this technology is the mid-IR-to-THz conversion efficiency $\eta$, which is defined as the ratio of the generated THz power to the product of the two mid-IR pump powers. Initial room-temperature devices demonstrated $\eta \approx 5$ $\mu W/W^2$, limited by inevitable THz free-carrier absorption in the doped parts of the mid-IR QCL core region. (See M. A. Belkin, et al., Appl. Phys. Lett. 92, 201101 (2008).) To overcome this problem, a new type of THz DFG-QCL was developed, based on Cherenkov phase-matching. (See K. Vijayraghavan, et al., Appl. Phys. Lett. 100, 251104 (2012).) These devices are grown on semi-insulating InP substrates that have relatively low THz loss and high refractive index at THz frequencies ($n_{THz} \approx 3.6$), significantly higher than the group index of the mid-IR modes in the laser waveguide ($n_g \approx 3.35$). In this situation, THz radiation produced by DFG leaks from the laser waveguide into the low-loss InP substrate at a Cherenkov angle ($\theta_{THz}=\cos^{-1}(n_g/n_{THz})$), and can thus be extracted along the whole length of the QCL waveguide. As a result, a dramatic improvement in mid-IR-to-THz conversion efficiency has been achieved in Cherenkov THz DFG-QCLs, with the value of $\eta$ exceeding 0.6 mW/W² for a ~2-mm-long ridge waveguide QCL operating in 3.5-4 THz range (K. Vijayraghavan, et al., Nature Comm. 4, 2021 (2013)) and being approximately 10 times smaller for similarly-sized devices operating around 1-2 THz (K. Vijayraghavan, et al., Nature Comm. 4, 2021 (2013) and Y. Jiang, et al., J. Opt. 16, 094002 (2014), (Invited paper)). This value of $\eta$ is obtained before correcting for an estimated 50% of THz collection efficiency of the THz power measurement setup. With this correction, the value of $\eta$ exceeds 1 mW/W² at 3.5-4 THz and drops to ~0.1 mW/W² for 1-2 THz operation. It has also been shown that Cherenkov DFG-QCL chips can provide continuously tunable THz emission spanning 1.2-5.9 THz range. (See Y. Jiang, et al., J. Opt. 16, 094002 (2014), (Invited paper)) To date the highest average powers achieved at room-temperature by Cherenkov THz DFG-QCLs have been varying from about 15-30 µW at 3.5-4 THz (K. Vijayraghavan, et al., Appl. Phys. Lett. 100, 251104 (2012) and Q. Y. Lu, et al., Appl. Phys. Lett. 104, 221105 (2014)) to 0.1-1 µW at ~1-1.5 THz (Y. Jiang, et al., J. Opt. 16, 094002 (2014), (Invited paper) and Q. Y. Lu, et al., Appl. Phys. Lett. 101, 251121 (2012).)

SUMMARY

Provided are terahertz quantum cascade laser devices for operation via the Cherenkov difference-frequency generation (DFG) scheme.

In one aspect, a terahertz quantum cascade laser device is provided comprising a substrate having a top substrate surface, a bottom substrate surface, and an exit facet extending between the top substrate surface and the bottom substrate surface at an angle $\theta_{tap}$ relative to normal to the top substrate surface. The device comprises a waveguide structure above the top substrate surface, the waveguide structure having a top surface, a bottom surface, a front facet extending between the top surface and the bottom surface and positioned proximate to the exit facet of the substrate, and a back facet extending between the top surface and the bottom surface and oppositely facing the front facet. The waveguide structure comprises a quantum cascade laser structure comprising a superlattice of quantum wells and barriers, the quantum cascade laser structure configured to generate light comprising light of a first frequency $\omega_1$, light of a second frequency $\omega_2$, and light of a third frequency $\omega_{THz}$, wherein $\omega_{THz}=\omega_1-\omega_2$; an upper cladding layer above the quantum cascade laser structure; and a lower cladding layer below the quantum cascade laser structure. The device comprises a distributed feedback (DFB) grating layer above the quantum cascade laser structure, the DFB grating layer comprising one or more grating regions, each grating region comprising grating elements which periodically alternate in a longitudinal direction across the device, wherein adjacent grating elements have different indices of refraction, the DFB grating layer configured to provide optical feedback for one or both of the light of the first frequency $\omega_1$ and the light of the second frequency $\omega_2$ and to produce lasing at one or both of the first frequency $\omega_1$ and the second frequency $\omega_2$, thereby resulting in laser emission at the third frequency $\omega_{THz}$ at a Cherenkov angle $\theta_{THz}$ through the bottom surface of the waveguide structure into the substrate and exiting the substrate through the exit facet. The device comprises a high-reflectivity coating on the front facet of the waveguide structure. In some embodiments, the device may be configured in a phase-locked array structure.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings, wherein like numerals denote like elements.

DETAILED DESCRIPTION

Provided are terahertz quantum cascade laser devices for operation via the Cherenkov difference-frequency generation (DFG) scheme.

In at least some embodiments, the disclosed devices exhibit greater mid-IR-to-THz conversion efficiencies as compared to conventional Cherenkov DFG-QCLs as well as higher powers. In at least some embodiments, the disclosed devices provide mass-producible broadly-tunable, room-temperature terahertz (THz) semiconductor laser sources, similar to infrared/visible (IR/VIS) diode lasers and mid-infrared (mid-IR) quantum cascade lasers (QCLs), thereby revolutionizing existing THz instrumentation by making systems for security screening, chemical sensing, and heterodyne detection much more affordable and compact.

Figure 1A:
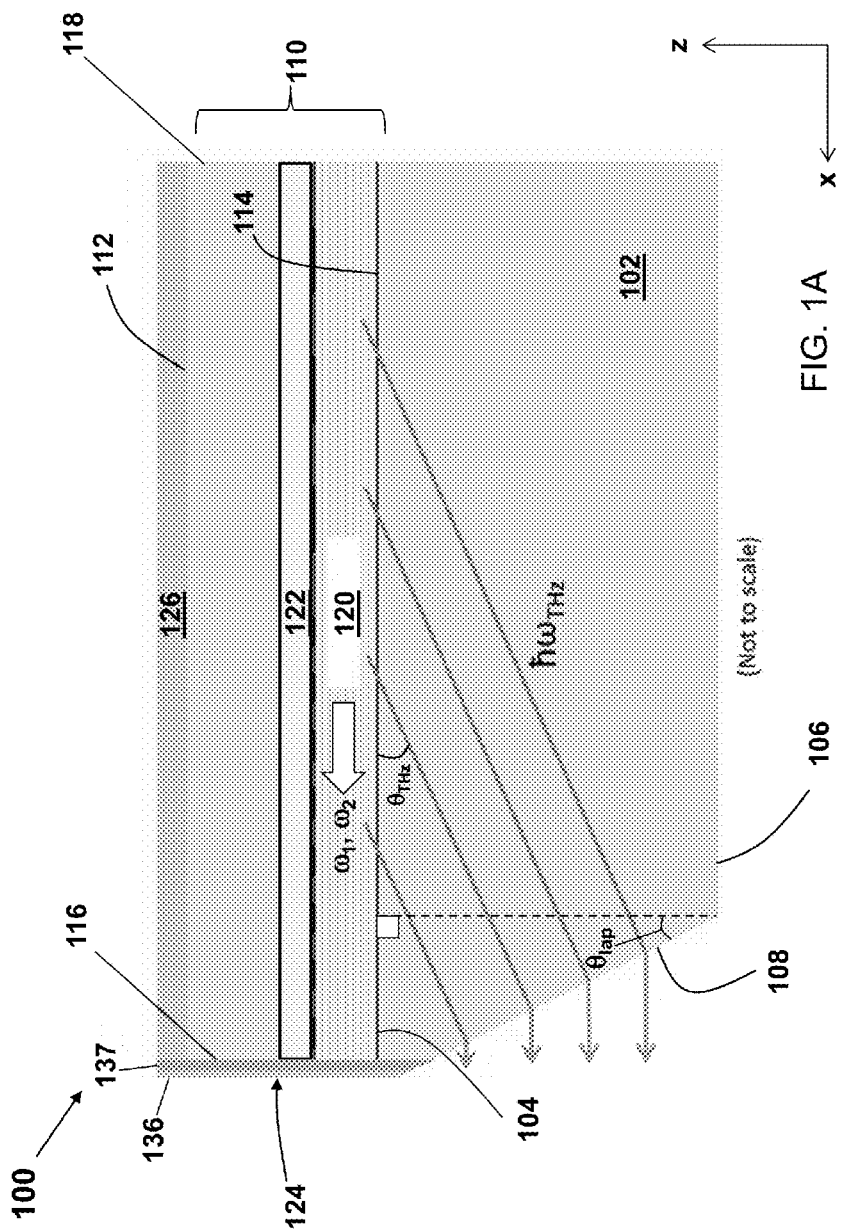
FIG. 1A shows a cross-sectional, side view of a terahertz quantum cascade laser device for operation via the Cherenkov difference-frequency generation (DFG) scheme according to an illustrative embodiment.

In one aspect, a terahertz quantum cascade laser device for operation via the Cherenkov difference-frequency generation (DFG) scheme is provided. A cross-sectional, side view of an illustrative device 100 is shown in FIG. 1A. The longitudinal dimension of the device is along axis x; the lateral dimension is along axis y, coming out of the plane of the paper. The device 100 includes a substrate 102 having a top substrate surface 104, a bottom substrate surface 106, and an exit facet 108 extending between the top substrate surface 104 and the bottom substrate surface 106 at an angle $\theta_{tap}$ relative to normal to the top substrate surface 104.

The device 100 further includes a waveguide structure 110 above the top substrate surface 104, the waveguide structure 110 having a top surface 112, a bottom surface 114, a front facet 116 extending between the top surface 112 and the bottom surface 114 and positioned proximate to the exit facet 108 of the substrate 102, and a back facet 118 extending between the top surface 112 and the bottom surface 114 and oppositely facing the front facet 116. The waveguide structure 110 includes a quantum cascade laser structure 120 including a superlattice of quantum wells and barriers, the quantum cascade laser structure 120 configured to generate light including light of a first frequency $\omega_1$, light of a second frequency $\omega_2$, and light of a third frequency $\omega_{THz}$, wherein $\omega_{THz}=\omega_1-\omega_2$. In the absence of any distributed feedback grating, the emission wavelengths of the quantum cascade laser structure 120 are (especially at high drives above threshold) spread over relatively wide wavelength ranges, each about a peak wavelength. Thus, the "first frequency $\omega_1$" may refer to the frequency at the peak of one range of emission wavelengths and the "second frequency $\omega_2$" may refer to the frequency at the peak of another range of emission wavelengths. The waveguide structure 110 is configured to guide the light generated within the quantum cascade laser structure 120 via the inclusion of material layer(s), e.g., cladding layer(s), as further described below.

The device 100 further includes a distributed feedback (DFB) grating layer 122 above the quantum cascade laser structure 120 which is configured to provide additional optical feedback for one or both of light of the first frequency $\omega_1$ and light of the second frequency $\omega_2$ so as to produce lasing at the first frequency $\omega_1$, the second frequency $\omega_2$, or both, thereby resulting in laser emission at the third frequency $\omega_{THz}$ at a Cherenkov angle $\theta_{THz}$ through the exit facet 108. The DFB grating layer 122 includes one or more grating regions, each grating region including grating elements which periodically alternate in a longitudinal direction across the device, wherein adjacent grating elements have different indices of refraction.

The device 100 further includes a high-reflectivity coating 124 on the front facet 116 of the waveguide structure 110. In this illustrative embodiment, the device 100 also includes a top contact layer 126. In this illustrative embodiment, the back facet 118 is uncoated, although a coating may be included thereon, e.g., an antireflective coating. Similarly, in this illustrative embodiment, the exit facet 108 is uncoated, although a coating such as an antireflective coating may be included thereon.

As will be further described below, through band engineering, the quantum cascade laser structure 120 is configured to generate light including light of at least two different frequencies, $\omega_1$ and $\omega_2$, via intersubband transitions, as well as light of the third frequency $\omega_{THz}$, via DFG. In general, Cherenkov emission occurs when the phase velocity of the non-linear polarization wave in a thin slab of non-linear optical material (e.g., the quantum cascade laser structure 120) is faster than the phase velocity of the generated light in the medium surrounding the slab (e.g., the substrate 102). This condition is satisfied when the refractive index $n_{THz}$ at THz frequencies of the substrate 102 is higher than the group index $n_g$ of the mid-IR modes in the quantum cascade laser structure 120. Then, light is emitted at the Cherenkov angle $\theta_{THz}=\cos^{-1}(n_g/n_{THz})$ through the bottom surface 114 of the waveguide structure 110 into the substrate 102. The exit facet 108 of the substrate 102 is polished (e.g., mechanically polished) at the angle $\theta_{tap}$ relative to normal to the top substrate surface 104. The angle $\theta_{tap}$ may be selected to minimize total internal reflection of the light at the third frequency $\omega_{THz}$ emitted at the Cherenkov angle $\theta_{THz}$ and to allow the THz light to emerge from the substrate in a direction approximately parallel with the top surface of the substrate 104 (see FIG. 4). The angle $\theta_{tap}$ for device 100 is about 30°. The angle $\theta_{tap}$ may be, for example, in the range of from about 10° to about 40° or from about 20° to about 40°.

Various semiconductor materials, e.g., group III-V semiconductor compounds, may be used for the substrate of the disclosed devices. Selection of the particular material depends upon the materials used in the quantum cascade laser structure (as further described below) and the requirement of Cherenkov emission (as described above). In some embodiments, the substrate is composed of undoped or semi-insulating InP.

Figure 1B:
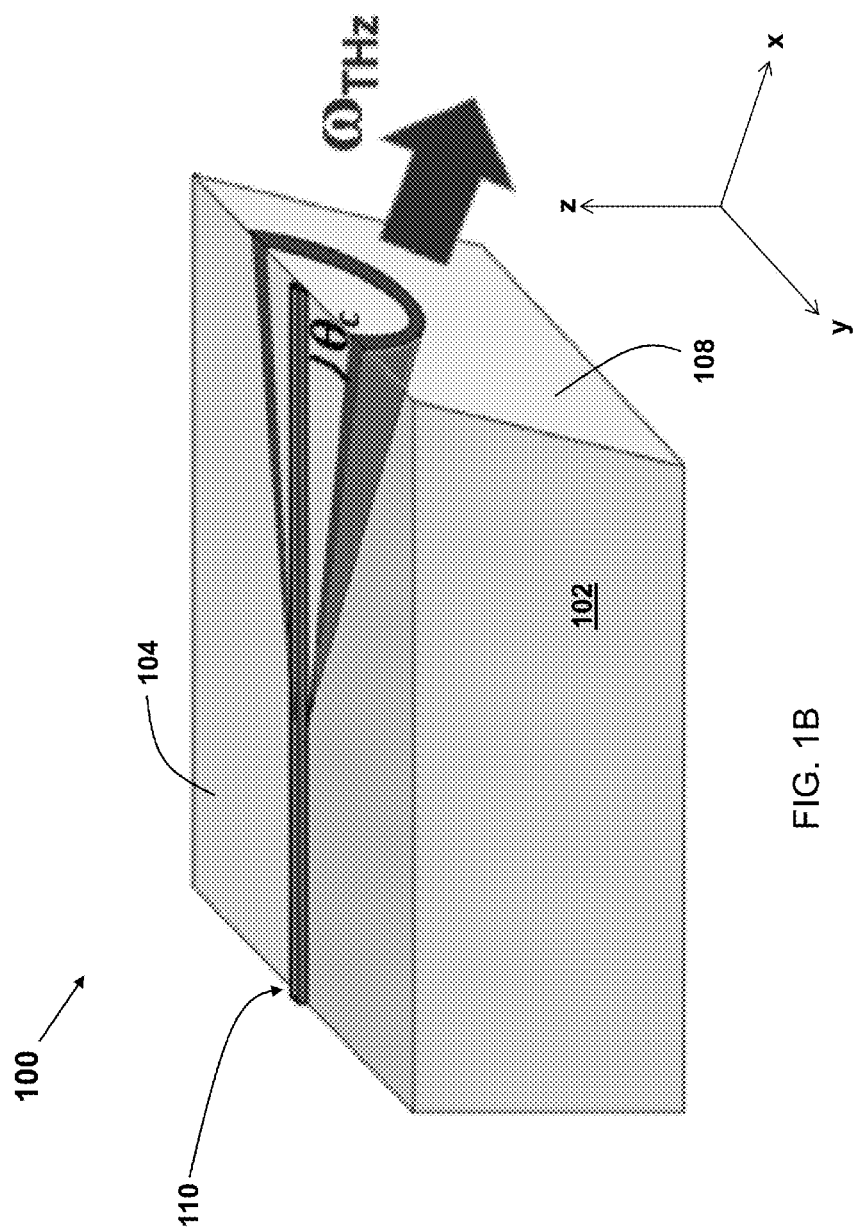
FIG. 1B shows a perspective view of the device of FIG. 1A.

A perspective view of the device 100 is shown in FIG. 1B. As illustrated in FIG. 1B, the materials of the waveguide structure 100 may be processed (e.g., via inductive plasma etching) to form a ridge, e.g., about 10-25 μm wide (across they axis), on the substrate 102. Additional material layers such as an insulating layer (e.g., SiN) may be formed on the walls of the ridge and the top contact layer 126 may be formed on the ridge (e.g., both via a variety of thin film deposition/growth techniques). The entire device 100 may then be cleaved to form bars, for example, having a length (along the z axis) in the range of from about 1 mm to about 1 cm, from about 1 mm to about 5 mm, e.g., about 2 mm, about 3 mm, about 4 mm, or about 5 mm. The exit facet 108 of the substrate 102 may then be polished at the angle $\theta_{tap}$ as described above.

As noted above, the quantum cascade laser structure of the disclosed devices includes a superlattice of quantum wells and barriers and is configured to generate light including light of the first frequency $\omega_1$, light of the second frequency $\omega_2$, and light of the third frequency $\omega_{THz}$ wherein $\omega_{THz}=\omega_1-\omega_2$. The quantum cascade laser structure is configured to exhibit sufficient second-order nonlinear susceptibility in order to support THz radiation based on DFG between light of the first frequency $\omega_1$ and light of the second frequency $\omega_2$, i.e., THz DFG.

Figures 2A, 2B:
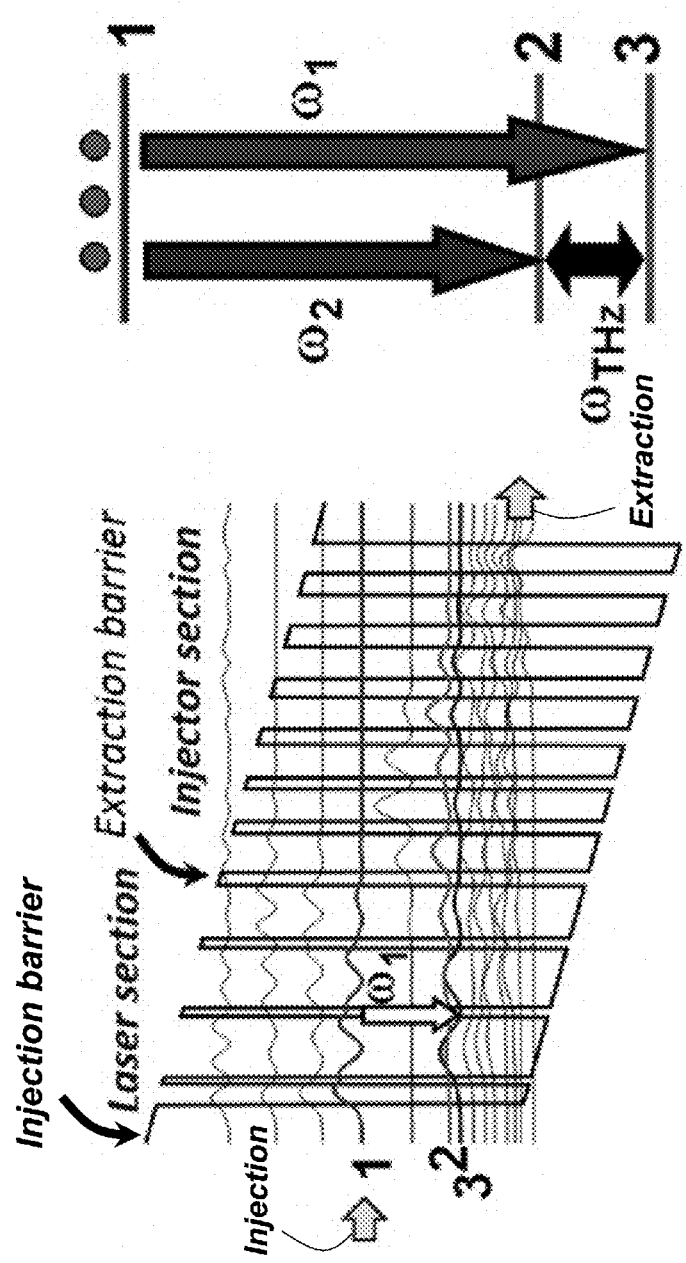
FIG. 2A shows the conduction-band diagram and relevant wavefunctions for a bound-to-continuum active region according to an illustrative embodiment.
FIG. 2B shows the equivalent energy level diagram for the band structure of FIG. 2A.

This may be achieved in a variety of ways. By way of illustration, the quantum cascade laser structure may include a first core including multiple stages, each stage including a first bound-to-continuum active region configured to generate light including the light of the first frequency $\omega_1$ and a second core including multiple stages, each stage including a second bound-to-continuum active region configured to generate light including light of the second frequency $\omega_2$. One or both of the first and second bound-to-continuum active regions are configured to exhibit relatively large second-order nonlinear susceptibility for THz DFG. The term "bound-to-continuum" refers to the mechanism of light generation in the active region under electrical bias. A bound-to-continuum active region is a superlattice of quantum wells and barriers in which light emission occurs via intersubband transitions between one upper energy state, primarily aligned with the ground state in the lower miniband of an injector region of the stage, and a miniband of the active region. FIG. 2A shows a conduction-band diagram under operating bias voltage of one illustrative stage (period) including a bound-to-continuum active region configured to generate light including light of a first frequency $\omega_1$. The wavy curves represent the electron wavefunctions. The electron states important for THz DFG are shown in bold and labeled 1 to 3. Electron injection and extraction are labeled. The laser section (i.e., the active region), the injector section, the injector barrier and the extraction barrier of the stage are also labeled. FIG. 2B shows the equivalent energy level diagram for the band structure shown in FIG. 2A. Electron population in the upper laser state is shown with circles.

A suitable quantum cascade laser structure including a first core including multiple stages, each stage including a first bound-to-continuum active region for primarily generating $\omega_1$ and a second core including multiple stages, each stage including a second bound-to-continuum active region for primarily generating $\omega_2$ is found in K. Vijayraghavan, et al., *Nature Comm.* 4, 2021 (2013), which is hereby incorporated by reference in its entirety. However, this quantum cascade laser structure may be further optimized to provide mid-IR gain in the 8-10 μm spectral region, rather than the 9-11 μm spectral region.

Figure 3A:
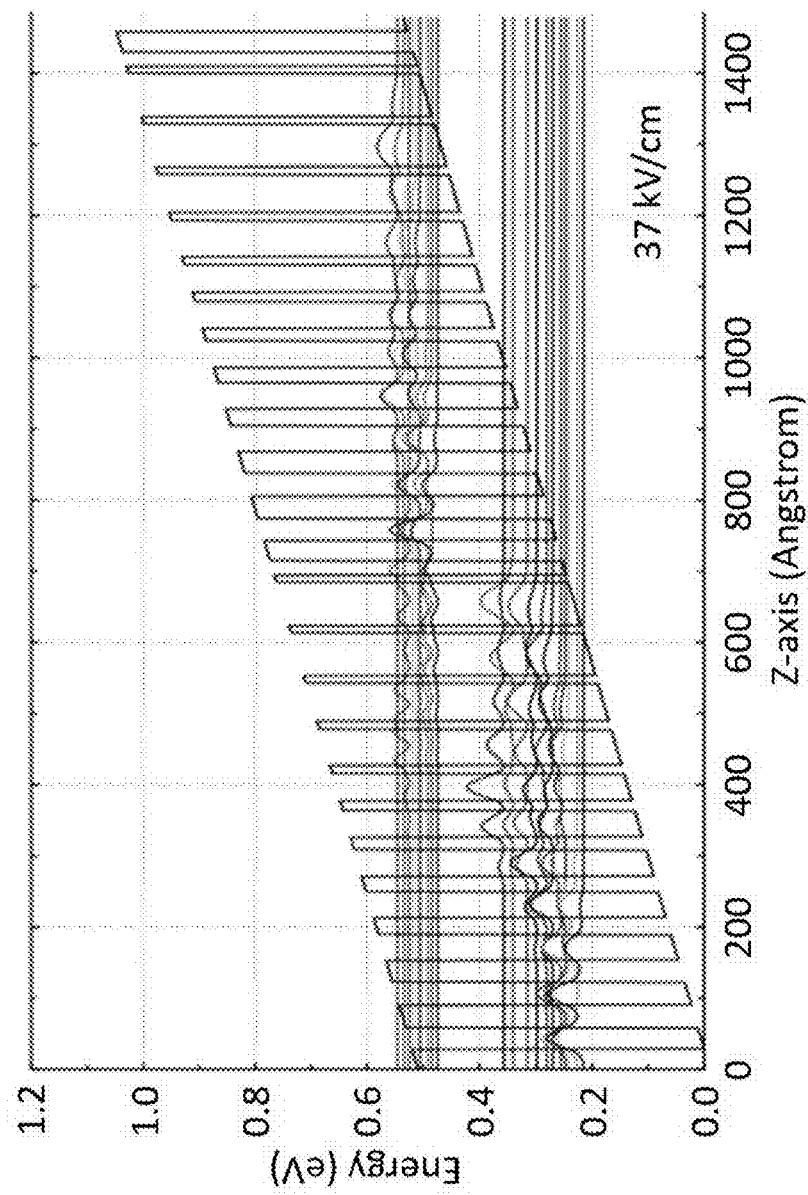
FIG. 3A shows the conduction-band diagram and relevant wavefunctions for a continuum-to-continuum active region under an applied field of 37 kV/cm according to an illustrative embodiment.
Figure 3B:
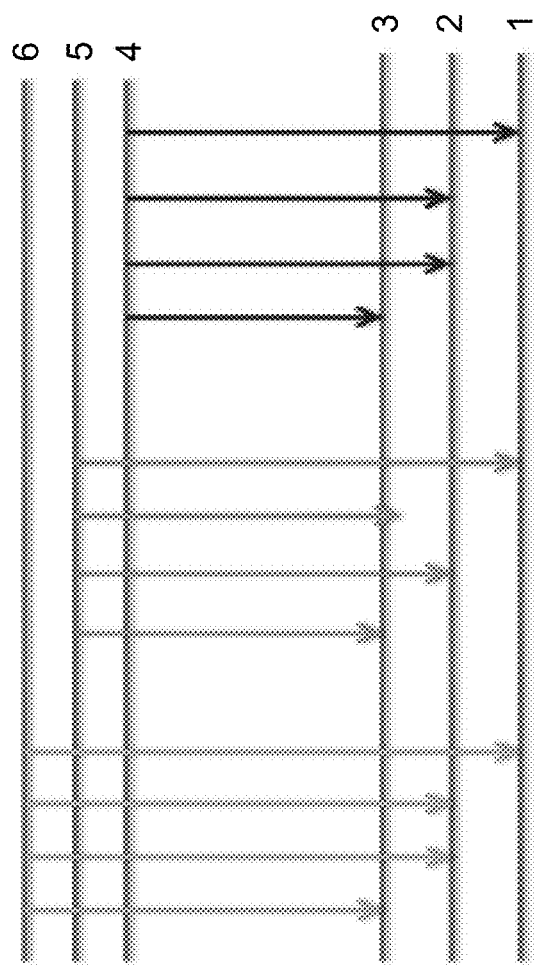
FIG. 3B shows three upper laser states and three lower laser states of the band structure of FIG. 3A which are important for THz DFG.

As another illustration, the quantum cascade laser structure may include a core including multiple stages, each stage including a continuum-to-continuum active region configured to exhibit sufficient second-order nonlinear susceptibility in order to support THz DFG. The term "continuum-to-continuum" also refers to the mechanism of light generation in the active region under electrical bias. A continuum-to-continuum active region is a superlattice of quantum wells and barriers in which light emission occurs via intersubband transitions between two minibands of the active region. (See B. Meng, et al., *Appl. Phys. Lett.* 107, 111110 (2015), which is hereby incorporated by reference in its entirety.) Thus, a continuum-to-continuum active region generates a range, which may be quite broad, of frequencies (including the first and second frequencies $\omega_1$ and $\omega_2$) and thus, can generate a range of possible THz frequencies (including the radiation at the third frequency $\omega_{THz}$). FIG. 3A shows a conduction-band diagram under operating bias voltage of two illustrative stages (periods), each stage including a continuum-to-continuum active region configured to generate light including light of the first frequency $\omega_1$, light of the second frequency $\omega_2$, and light of the third frequency $\omega_{THz}$ via DFG. The wavy curves represent the electron wavefunctions of the upper laser states and the lower laser states. FIG. 3B shows three upper laser states and three lower laser states of the band structure shown in FIG. 3A which are important for THz DFG. Continuum-to-continuum active regions may be useful to increase the nonlinear conversion efficiency η of the disclosed devices. The nonlinear conversion efficiency η is defined as the ratio of THz power output from the device $W(\omega_{THz})$ to the product of mid-IR pump power outputs $W(\omega_1)W(\omega_2)$ from the device, $\eta = W(\omega_{THz})/[W(\omega_1)W(\omega_2)]$. Simulations may be performed using the slab-waveguide model of Cherenkov THz-DFG emission following the approach described in K. Vijayraghavan, et al., *Nature Comm.* 4, 2021 (2013) for calculating the nonlinear conversion efficiency η values of the disclosed devices.

The quantum cascade laser structures of the disclosed devices may include various numbers of stages (e.g., 10, 20, 30, 40, 50, 60, etc.) as well as various numbers of cores (e.g., 1, 2, etc.). The quantum cascade laser structures may include additional material layers, e.g., a heat-spreading layer between adjacent cores for lateral heat removal.

Band engineering is used (i.e., selection of the composition, thicknesses, and arrangement of the quantum wells and barriers in the stages of the quantum cascade laser structures, particularly the active regions) to provide the desired mechanism of light generation, the desired first and second frequencies $\omega_1$ and $\omega_2$ (or range of frequencies) and the desired second-order nonlinear susceptibilities to support THz DFG. The wavelengths of light generated by the quantum cascade laser structures will generally be in the mid-IR range, e.g., from about 5 μm to about 20 μm, in order to provide THz radiation in the frequency range of from about 1 THz to about 6 THz via DFG. This includes embodiments in which the wavelengths of light are in the range of from about 5 μm to about 15 μm, or from about 8 μm to about 11 μm and in which the generated THz radiation can be in the frequency range of from about 1 THz to about 5 THz, or from about 1 THz to about 4 THz. Other illustrative quantum cascade laser structures which may be used (or optimized for use) in the disclosed devices include those described in U.S. Pat. No. 7,974,325 and International Patent Publication WO 2014018599, each of which is hereby incorporated by reference in its entirety.

Various semiconductor materials, e.g., group III-V semiconductor compounds, may be used for the layers of the quantum cascade laser structure of the disclosed devices. Selection of the particular materials is driven, at least in part, by the band engineering considerations described above. By way of illustration, InGaAs/InAlAs heterostructures may be used. As is known in the field, the relative amounts of the elements in such semiconductor compounds may vary, i.e., "InGaAs" encompasses those compositions $In_xGa_{1-x}As$, wherein x varies from about 0 to about 1. Heat-spreading layers may be composed of InP. Crystal growth methods such as molecular beam epitaxy (MBE) and metal-organic chemical vapor deposition (MOCVD) may be used to form the quantum cascade laser structures.

As noted above, the disclosed devices include a DFB grating layer which is configured to provide optical feedback for one or both of light of the first frequency $\omega_1$ and light of the second frequency $\omega_2$ so as to produce lasing at the first frequency $\omega_1$, the second frequency $\omega_2$, or both, i.e., single- or dual single-frequency operation. The DFB grating layer includes one or more grating regions, each grating region including grating elements which periodically alternate in a longitudinal direction across the device, wherein adjacent grating elements have different indices of refraction. In some embodiments, a grating region may be characterized by a periodicity $\Lambda = m\lambda/(2n_{eff})$, where m is the grating order, λ is the desired wavelength of light (i.e., light of the first or second frequencies $\omega_1$, $\omega_2$) from the quantum cascade laser structure and $n_{eff}$ is the effective index of refraction of the region for λ. In other words, the grating elements alternate with the periodicity Λ. In some embodiments, m=1. In other embodiments, m=2.

Figure 4:
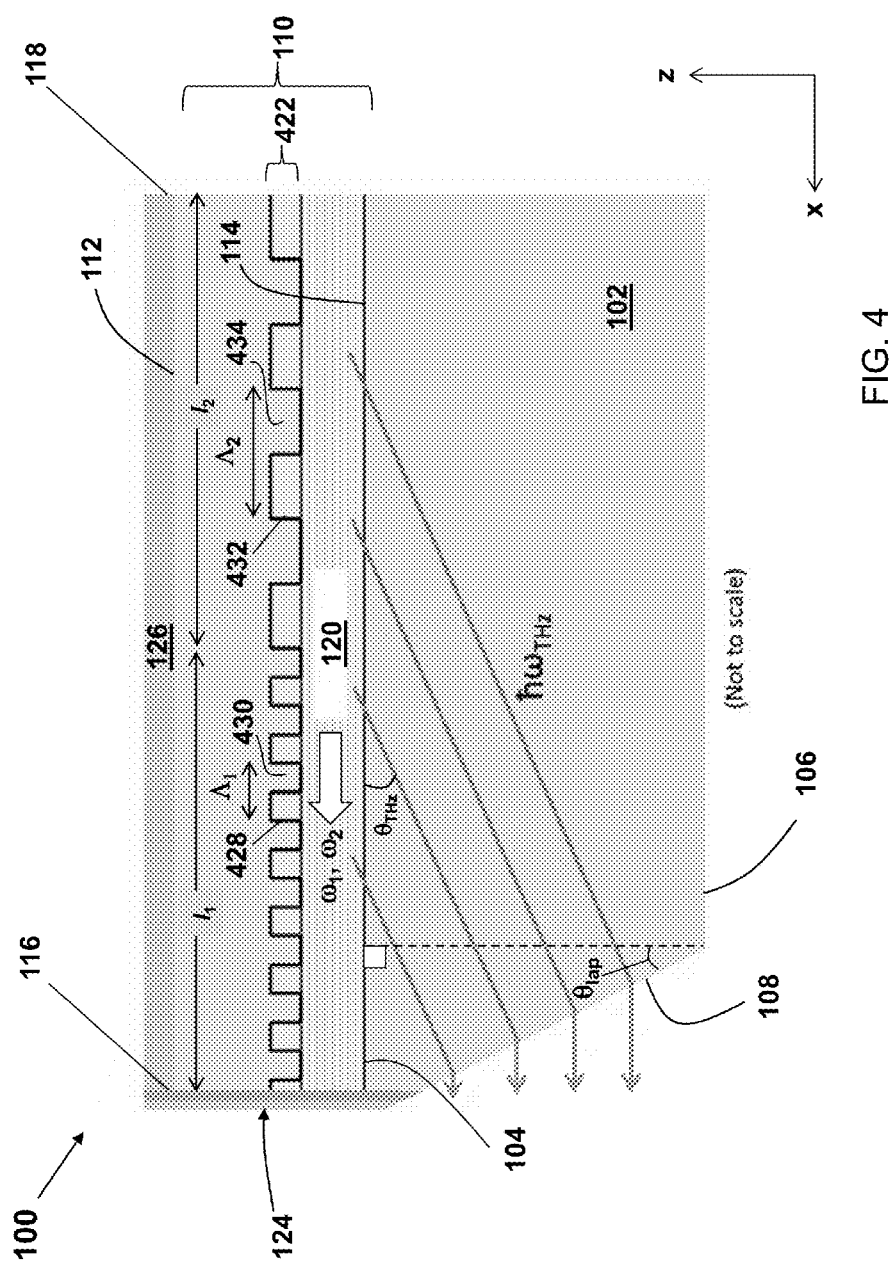
FIG. 4 shows the cross-sectional, side view of the device of FIG. 1A with a distributed feedback (DFB) grating layer configured with two back-to-back distributed feedback gratings.

FIG. 4 shows the device 100 of FIG. 1A including an illustrative DFB grating layer 422 (i.e., DFB grating layer 422 is an embodiment of DFB grating layer 122). As illustrated in FIG. 4, the DFB grating layer 422 includes two grating regions of periodically alternating grating elements, the grating regions characterized by a first period $\Lambda_1$ and a second period $\Lambda_2$, respectively. Adjacent grating elements 428 and 430 in a first grating region are labeled, providing the first period $\Lambda_1$. The first grating region is a $1^{st}$-order grating region for which the Bragg condition is satisfied for light of the first frequency $\omega_1$. Adjacent grating elements 432 and 434 in a second grating region are also labeled, providing the second period $\Lambda_2$. The second grating region is a $1^{st}$-order grating region for which the Bragg condition is satisfied for light of the second frequency $\omega_2$. In this illustrative embodiment, the DFB grating layer 422 is characterized as including two "back-to-back" distributed feedback gratings. The DFB grating layer 422 provides optical feedback for both light of the first frequency $\omega_1$ and light of the second frequency $\omega_2$ so as to produce lasing at both the first and second frequencies $\omega_1$, $\omega_2$.

In an alternative configuration, a grating region of periodically alternating grating elements of the DFB grating layer may be configured as a biperiodic binary grating region. Biperiodic binary grating regions are grating regions for which the Fourier transform of the grating region includes two peaks (e.g., a peak corresponding to light of the first frequency $\omega_1$ and a peak corresponding to light of the second frequency $\omega_2$). Thus, biperiodic binary grating regions provide optical feedback for both light of the first frequency $\omega_1$ and light of the second frequency $\omega_2$ so as to produce lasing at both the first and second frequencies $\omega_1$, $\omega_2$. Biperiodic binary grating regions such as those described in T. Hidaka et al., *Electron. Lett.* 27, pp. 1075-1076 (1991), which is hereby incorporated by reference in its entirety, may be used. Biperiodic binary grating regions (which may be referred to as dual periodicity gratings) such as those described in F. Castellano et al., *Applied Physics Letters* 106, 011103 (2015), which is hereby incorporated by reference in its entirety, may also be used. An illustrative DFB grating layer 522 including a biperiodic binary grating region 540 is shown in FIG. 5 and is further described below.

With reference back to FIG. 4, the DFB grating layer 422, whether including two back-to-back distributed feedback gratings as shown in FIG. 4, or including a single biperiodic binary grating region, is particularly useful with quantum cascade laser structures which include bound-to-continuum active regions.

The grating region(s) of the DFB grating layer of the disclosed devices may be characterized by its length l along the longitudinal axis of the device. As shown in FIG. 4, a length $l_1$ of the first grating region and a length $l_2$ of the second grating region of the DFB grating layer 422 of the device 100 are labeled. In this illustrative embodiment, the lengths $l_1$ and $l_2$ are substantially equal (i.e., equal, but not necessarily perfectly equal) to one another and are also sufficiently long to substantially span the length of the waveguide structure 110 (i.e., the cavity length). ("Substantially span" has the same meaning with respect to the lengths of the grating regions as compared to the waveguide structure as the phrase "substantially equal.") However, the lengths $l_1$ and $l_2$ need not be equal. In the illustrative embodiment, $l_1$ is about 2 mm and $l_2$ is about 2 mm (total cavity length ~4 mm). In other embodiments, the length of a grating region (or the combined lengths of multiple grating regions) spans only a portion of the length of the waveguide structure such that one or more gratingless regions are defined within the DFB grating layer. By "gratingless" it is meant that the region does not include the periodically alternating grating elements. Thus, a gratingless region may be composed of a single type of material, e.g., one of the materials of the grating elements.

Figure 5:
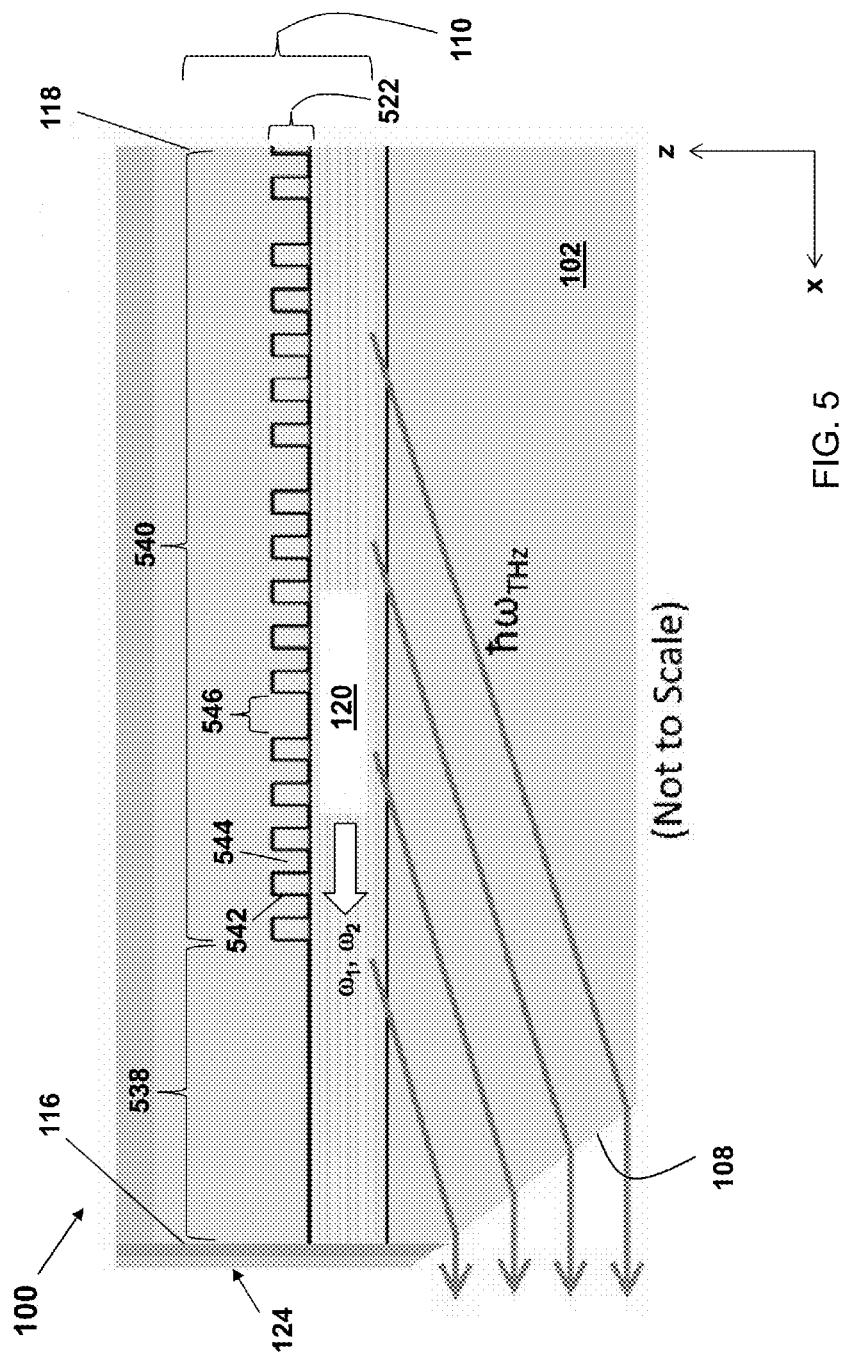
FIG. 5 shows the cross-sectional, side view of the device of FIG. 1A with a DFB grating layer including a gratingless region and a biperiodic binary grating region.

By way of illustration, a DFB grating layer 522 including a gratingless region 538 and a biperiodic binary grating region 540 is shown in FIG. 5. FIG. 5 shows the device 100 of FIG. 1A including the illustrative DFB grating layer 522 (i.e., DFB grating layer 522 is another embodiment of DFB grating layer 122). The substrate 102, exit facet 108, waveguide structure 110, front facet 116, back facet 118, quantum cascade laser structure 120, and high-reflectivity coating 124 are labeled. The back facet 118 is uncoated. The biperiodic binary grating region 540 includes periodically alternating grating elements, two of which are labeled 542, 544. One of the periodic $\pi$ phase shifts is also labeled 546. Various respective lengths (generally indicated by the 538 bracket and the 540 bracket) of the gratingless region 538 and the biperiodic binary grating region 540 may be used as further described below. In the illustrative embodiment, the length of the gratingless region 538 is about 0.5 mm and the length of the biperiodic binary grating region 540 is about 1.5 mm (total cavity length ~2 mm). The DFB grating layer 522 is useful for quantum cascade laser structures which include continuum-to-continuum active regions.

In other embodiments, the DFB grating layer of the disclosed devices includes a single grating region, e.g., a single grating region of periodically alternating grating elements characterized by a periodicity $\Lambda=m\lambda/(2n_{\mathit{eff}})$ as described above. The single grating region may substantially span the length of the waveguide structure or the single grating region may span only a portion of the waveguide structure so as to define a gratingless region. By way of illustration, a device having a total cavity length of ~2 mm may include a single grating region having a length of ~1.5 mm and a single gratingless region having a length of ~0.5 mm. A DFB grating layer including a single grating region provides optical feedback and lasing for a single frequency of light. This is useful when the device is to be used in an external cavity (EC) configuration, in which case the second frequency of light (exiting the back facet of the device) needed for THz light generation via DFG is selected by the EC. Suitable EC configurations include those in K. Vijayraghavan, et al., *Nature Comm.* 4, 2021 (2013) and in Y. Jiang, et al., *Sci. Rep.* 6, 21169 (2016).

The particular configuration of the DFB grating layer, e.g., as determined by the number of grating regions, the type of grating (e.g., periodicity $\Lambda$ or biperiodic binary), the relative lengths of grating regions and the presence of gratingless regions may be selected, at least in part, to maximize the THz extraction efficiency of the disclosed devices as well as to achieve desired relative values of threshold-current densities $J_{th}$ for the two desired frequencies of light $\omega_1$, $\omega_2$, as further described below.

The position of the DFB grating layer with respect to the quantum cascade laser structure is not particularly limited. As shown in FIGS. 1A, 4 and 5, each of the DFB grating layers is a buried DFB grating layer, i.e., is embedded within the multilayer waveguide structure 110. The DFB grating layer may be disposed on the top surface of the quantum cascade laser structure. However, surface DFB grating layers may be used, disposed on the top surface of the waveguide structure itself. By way of illustration, a surface DFB grating layer may be formed by appropriately configuring the top surfaces of the cap layer 662 and the plasmon layer 660 (see FIG. 6) and the bottom surface of the overlying top contact layer 126 (see FIG. 1A), as further described below.

Various materials, e.g., semiconductor materials, may be used for the DFB grating layer of the disclosed devices. By way of illustration, group III-V semiconductor compounds may be used to form the periodically alternating grating elements wherein adjacent grating elements have different indices of refraction (i.e., different semiconductor compositions). Known techniques may be used to form the DFB grating layer, e.g., e-beam lithography and wet chemical etching. For example, after growing the quantum cascade laser structure, an etch-stopping layer may be formed thereon (e.g., ~0.1 µm-thick InP). The DFB grating layer may then be formed by forming a layer of a first semiconductor over the etch-stopping layer, etching the layer of the first semiconductor to provide a first set of separated grating elements, and forming a layer of a second semiconductor over and/or in between the first set of separated grating elements to provide a second set of separated grating elements. Selection of the particular materials used for the DFB grating layer depends, at least in part, upon the materials used in the quantum cascade laser structure. In some embodiments, the first semiconductor is InGaAs and the second semiconductor is InP. Surface DFB grating layers may be similarly formed, however, one of the sets of separated grating elements may be composed of a semiconductor or semiconductors (e.g., the cap layer 662 and part of the plasmon layer 660) and the other set of separated grating elements may be composed of a metal or metals (e.g., the top contact layer 126).

The waveguide structure of the disclosed devices includes other material layers, for example, to guide light generated in the quantum cascade laser structure. By way of illustration, the waveguide structure may include an upper cladding layer disposed above the quantum cascade laser structure, and in embodiments, disposed above the DFB grating layer. A lower cladding layer may be disposed under the quantum cascade laser structure. Similarly, other material layers, e.g., current spreading layers, plasmon layers, cap layers, contact layers, etc. may be included in the disclosed devices. Such material layers may or may not be considered to be part of the waveguide structure. A current spreading layer may be disposed under the quantum cascade laser structure, and in some embodiments, under the lower cladding layer. A plasmon layer may be disposed above the upper cladding layer. A cap layer may be disposed above the plasmon layer. A contact layer may be disposed above the cap layer. Various compositions may be used for these additional material layers. By way of illustration, InGaAs may be used for the current spreading layer. InP may be used (at various doping levels) for the cladding layers, plasmon layer and cap layer. Metals, e.g., titanium, gold, etc., may be used for the contact layer(s). Known thin film deposition/growth techniques may be used to form these additional material layers.

As noted above, the disclosed devices further include a high-reflectivity coating on the front facet of the waveguide structure. The high-reflectivity coating is disposed on the front facet, by contrast to conventional devices which do not use such coatings proximate to the exit facet (the facet through which laser emission occurs) in order to avoid blocking laser emission. Instead, conventional devices utilize high-reflectivity coatings on the back facets of waveguide structures. However, as further described below, it has been found that the use of the disclosed high-reflectivity coatings on the front facet of the waveguide structure significantly improves the extraction of THz laser emission from the disclosed devices, and thus, the mid-IR-to-THz conversion efficiencies.

An illustrative high-reflectivity coating 124 is shown in FIG. 1A. The high-reflectivity coating 124 is on the front facet 116 of the waveguide structure 110, rather than the back facet 118. In this embodiment, the back facet 118 is uncoated. A variety of reflective materials (e.g., reflective to mid-infrared light, e.g., 5 μm to 20 μm) may be used for the high-reflectivity coating. The reflectivity to mid-infrared light may be in the range of from about 85% to about 99%. In the illustrative embodiment, the high-reflectivity coating 124 includes an outer layer 136 of gold and an inner layer 137 of $YF_2$ (or $Al_2O_3$ or ZnSe). Other similar materials may be used. Various thicknesses for the high-reflectivity coating may be used. In the illustrative embodiment, the outer layer 136 is about 100 nm thick and the inner layer 137 is about 200 nm thick. Various thin film deposition/growth techniques (e.g., evaporation) may be used to form the high-reflectivity coating.

Figure 6:
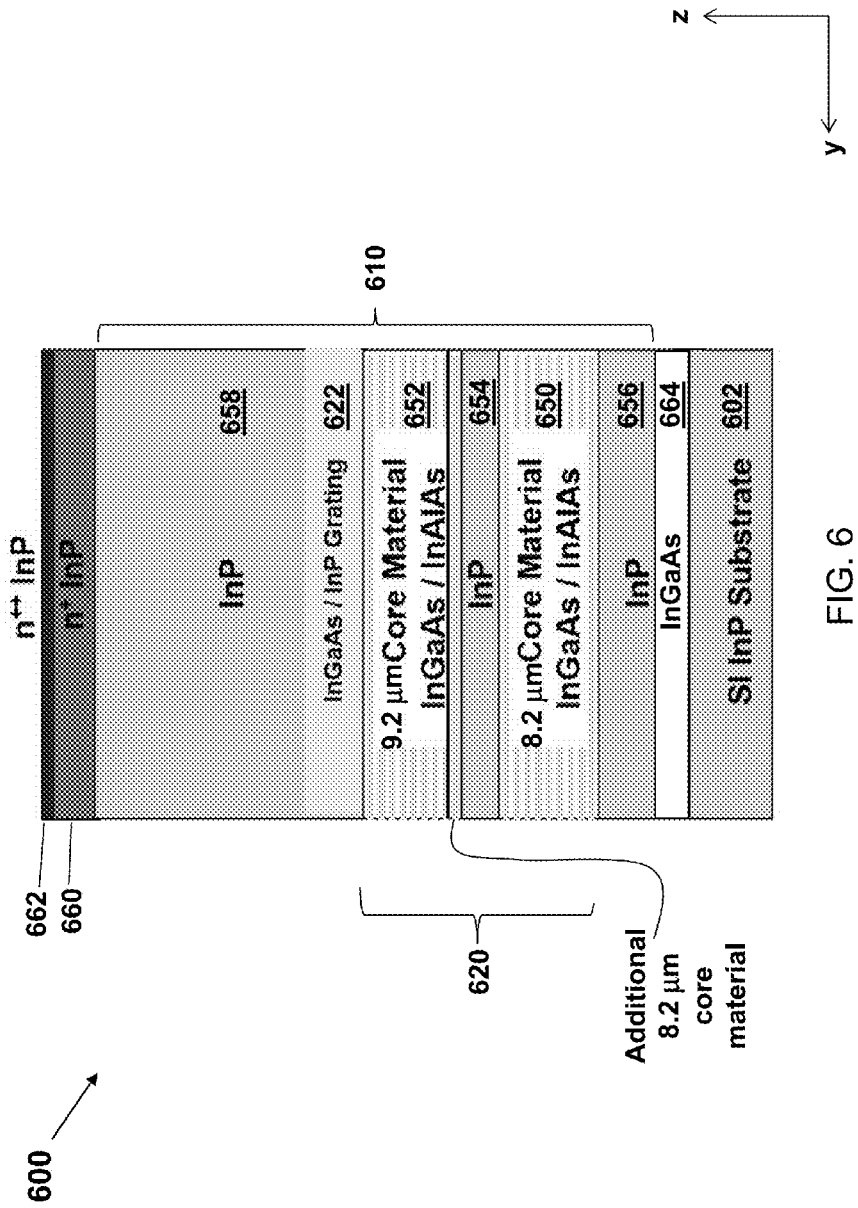
FIG. 6 shows a cross-sectional view of a portion of a terahertz quantum cascade laser device for operation via the Cherenkov DFG scheme according to an illustrative embodiment.

A cross-sectional view (facet view) of a portion of an illustrative device 600 is shown in FIG. 6. The device 600 includes a substrate 602 (semi-insulating InP) and a waveguide structure 610. The waveguide structure 610 includes a quantum cascade laser structure 620 including a first (lower) core 650 including multiple stages (20), each stage including a first bound-to-continuum active region configured to generate light including light of the first frequency $\omega_1$ ($\lambda_1$=8.2 μm) and a second (upper) core 652 including multiple stages (26), each stage including a second bound-to-continuum active region configured to generate light including the light of the second frequency $\omega_2$ ($\lambda_2$=9.2 μm). Both of the first and second bound-to-continuum active regions are formed from InGaAs/InAlAs and are configured to exhibit relatively large second-order nonlinear susceptibility for THz DFG. The bound-to-continuum active regions used were those described in K. Vijayraghavan, et al., *Nature Comm.* 4, 2021 (2013), but optimized to provide mid-IR gain in the 8-10 μm spectral regional region. In this illustrative embodiment, the upper core 652 further includes multiple (6) stages including the first bound-to-continuum active region. Mixing stages of different emission wavelengths is useful to achieve the desired relative values of threshold-current densities $J_{th}$ for the two desired frequencies of light $\omega_1$, $\omega_2$ (e.g., $J_{th}$ values for the two desired frequencies of light that are within about ±10%). In addition, a ~0.5 μm-thick heat-spreading layer 654 separates the upper and lower cores 652, 650.

The device 600 further includes a DFB grating layer 622 above the quantum cascade laser structure 620 which is configured to provide optical feedback for both 8.2 μm and 9.2 μm wavelengths. The DFB grating layer 422 of FIG. 4 may be used, i.e., including two back-to-back distributed feedback gratings (or alternatively, the DFB grating layer 622 may include a single biperiodic binary grating region) spanning the length of the waveguide structure (total cavity length ~4 mm). The waveguide structure 610 further includes a lower cladding layer 656 and an upper cladding layer 658. The device 600 further includes a plasmon layer 660 and a cap layer 662. The device 600 further includes a current spreading layer 664. The configuration of device 600 otherwise follows that described above for device 100 of FIG. 1A, i.e., high-reflectivity coating on the front facet, beveled substrate, uncoated back facet. The frequency of laser emission ($\omega_{THz}$) of the device 600 is about 4 THz.

The extraction efficiency of THz light from the device 600 either having the DFB grating layer 422 of FIG. 4 or the single biperiodic binary grating region were calculated and compared to the extraction efficiency of a comparative device having uncoated front facets. The devices were modeled using coupled-mode theory (CMT). (See R. J. Noll and S. H. Macomber, *IEEE J. Quantum Electron.* 26, pp. 456-466 (1990).) Coupled-mode theory can separate the field intensity into forward (R) and backward (S) traveling waves. The calculations for the extraction efficiency were performed as followed. All R and S fields were normalized according to:

$$\int_0^L |R_x|^2 + |S_x|^2 \, dz = 1 \qquad \text{Equation 1}$$

where L is the length of the device. The degree of extraction of generated THz light from the front facet side, which is called S (output) coupling, was calculated by:

$$\int_0^{z_{max}} |S_{8.2}|^2 |S_{9.2}|^2 e^{-\alpha l} \, dz = \int_0^{z_{max}} |S_{8.2}|^2 |S_{9.2}|^2 e^{-\alpha_{sub} \frac{\csc\theta_{THz}}{(\tan\theta_{tap}+\cot\theta_{THz})}} \, dz \qquad \text{Equation 2}$$

where $z_{max}$, the maximum position for which THz light is emitted through the exit facet, is calculated based on the substrate thickness, $t_{sub}$, Cherenkov angle $\theta_{THz}$, and angle $\theta_{tap}$, by:

$$z_{max} = t_{sub}(\tan\theta_{tap} + \cot\theta_{THz}) \qquad \text{Equation 3}$$

The angles and dimensions have been labeled in FIG. 1A. $\alpha_{sub}$ is the THz radiation absorption coefficient in the substrate. In some embodiments, $\theta_{THz}$=20°, $\theta_{tap}$=30°, $\alpha_{sub}$=15 cm$^{-1}$ for an InP substrate at about 4 THz. For an InP substrate thickness ($t_{sub}$) of about 350 µm, the maximum longitudinal position, $z_{max}$, is about 1.16 mm. For a substrate thickness of about 500 µm, the $z_{max}$ value is about 1.66 mm.

Figure 8A:
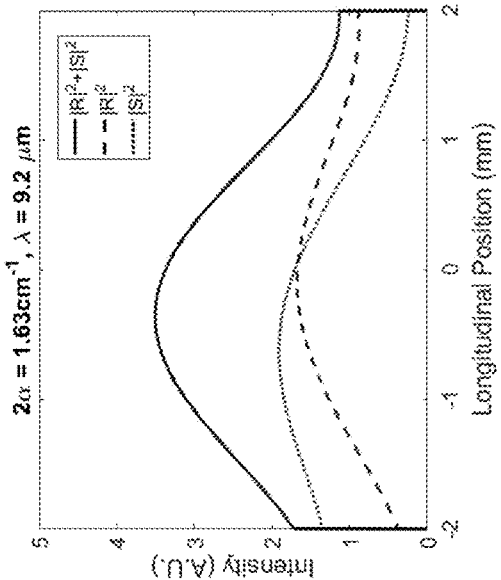
FIG. 8A shows the guided-field intensity profiles for the lowest-loss mode at 8.2 μm wavelength for the device of FIG. 6 having a DFB grating layer including a single biperiodic binary grating region spanning the length of the device and uncoated front and back facets. The wave phase shifts with respect to the back and front facets were $\Delta\phi_b=0°$ and $\Delta\phi_f=45°$, respectively.
Figure 8B:
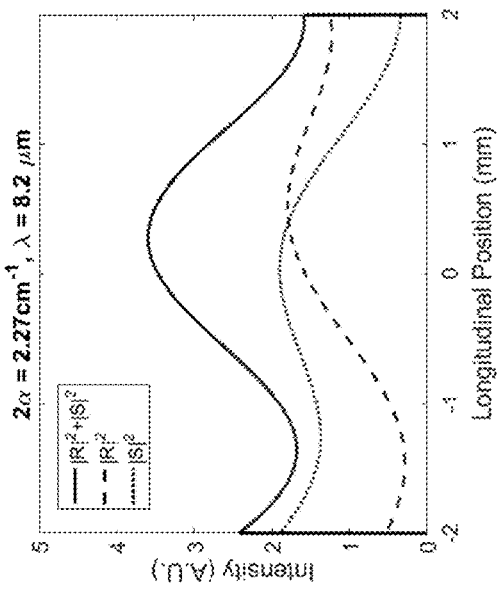
FIG. 8B shows the guided-field intensity profiles for the lowest-loss mode at 9.2 μm wavelength.

FIGS. 8A-8B show the guided-field intensity profiles for $\lambda_1$=8.2 µm (FIG. 8A) and $\lambda_2$=9.2 µm (FIG. 8B) for a comparative device. The comparative device has the same structure as the device 600 of FIG. 6, except that both the front and back facets are uncoated. The DFB grating layer 622 includes a single biperiodic binary grating region spanning the length of the waveguide structure (~4 mm). The longitudinal position (see axis x in FIG. 4) at 0 corresponds to the center of the waveguide structure; the longitudinal position at −2 mm corresponds to the front facet; and the longitudinal position at 2 mm corresponds to the rear facet. As can be seen from the figures, both the R and S waves are spread throughout the device length. In turn, since only about 1.16 mm of the device length from either facet is effective for extraction of the THz light, the extraction efficiency is quite low.

Figure 9A:
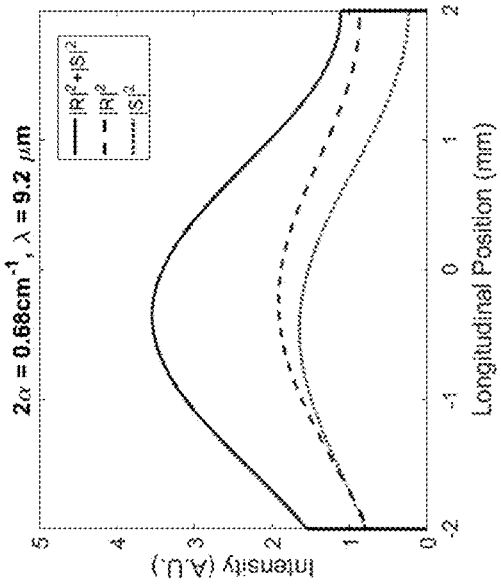
FIG. 9A shows the guided-field intensity profiles for the lowest-loss mode at 8.2 μm wavelength for the device of FIG. 6 having a DFB grating layer including a single biperiodic binary grating region spanning the length of the device and a front facet coated with a high-reflectivity (HR) coating and an uncoated back facet. The wave phase shifts with respect to the back and front facets were $\Delta\phi_b=0°$ and $\Delta\phi_f=45°$, respectively.
Figure 9B:
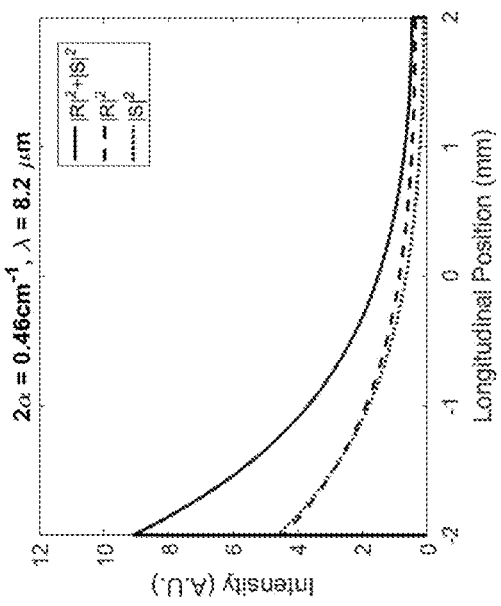
FIG. 9B shows the guided-field intensity profiles for the lowest-loss mode at 9.2 μm wavelength.

By contrast to the comparative device, as illustrated in FIGS. 9A-9B, the extraction efficiency is significantly greater for the device 600 of FIG. 6 having the single biperiodic binary grating region spanning the length of the waveguide structure and the front facet coated with the high-reflectivity (HR) coating/uncoated back facet. In this case, there is very good overlap between the 8.2 µm and 9.2 µm S waves close to the front facet. In turn, the extraction efficiency of the device 600 is about 2 times greater than the comparative device (FIGS. 8A-8B). The improvement in extraction efficiency is observed for most combinations of $\Delta\phi_b$ and $\Delta\phi_f$ values.

Figures 10A, 10B:
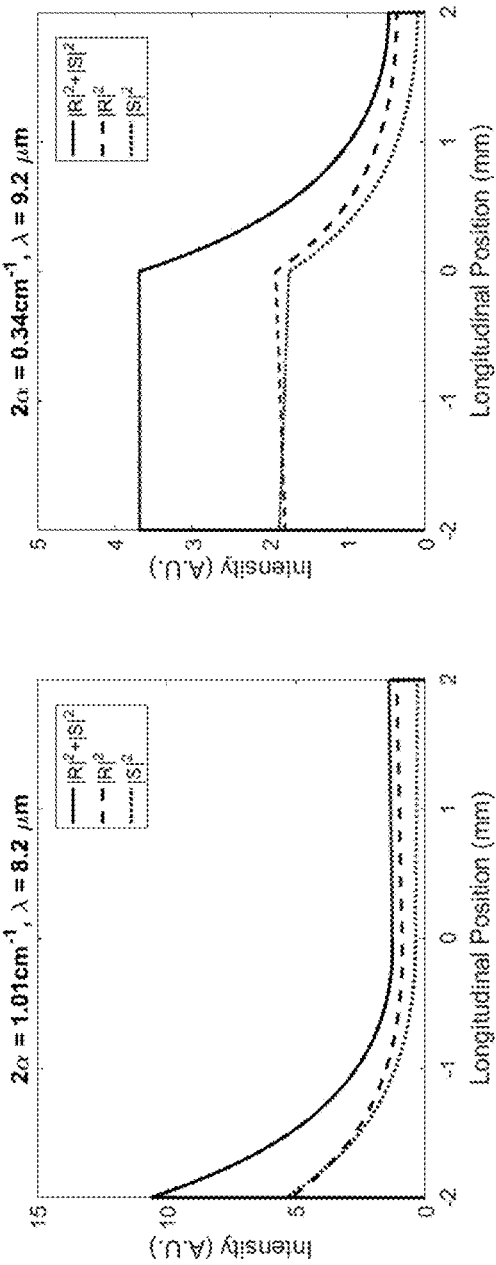
FIG. 10A shows the guided-field intensity profiles for the lowest-loss mode at 8.2 μm wavelength for the device of FIG. 6 having a DFB grating layer including two back-to-back grating regions and a front facet coated with a HR coating and an uncoated back facet. The wave phase shifts with respect to the back and front facets were $\Delta\phi_b=0°$ and $\Delta\phi_f=45°$, respectively.
FIG. 10B shows the guided-field intensity profiles for the lowest-loss mode at 9.2 μm wavelength.

As illustrated by FIGS. 10A-10B, the extraction efficiency for the device 600 of FIG. 6 having the DFB grating layer 422 of FIG. 4 (two back-to-back grating regions) is even greater as compared to the comparative device (FIGS. 8A-8B). As noted above, the front facet is coated with the HR coating and the back facet is uncoated. In this case, the overlap between the 8.2 µm and 9.2 µm S waves close to the HR coated front facet is even stronger than for the device 600 with the single biperiodic binary grating region (FIGS. 9A-9B). The extraction efficiency of the device 600 having the DFB grating layer 422 of FIG. 4 is about 3 times greater than the comparative device (FIGS. 8A-8B).

Figure 7:
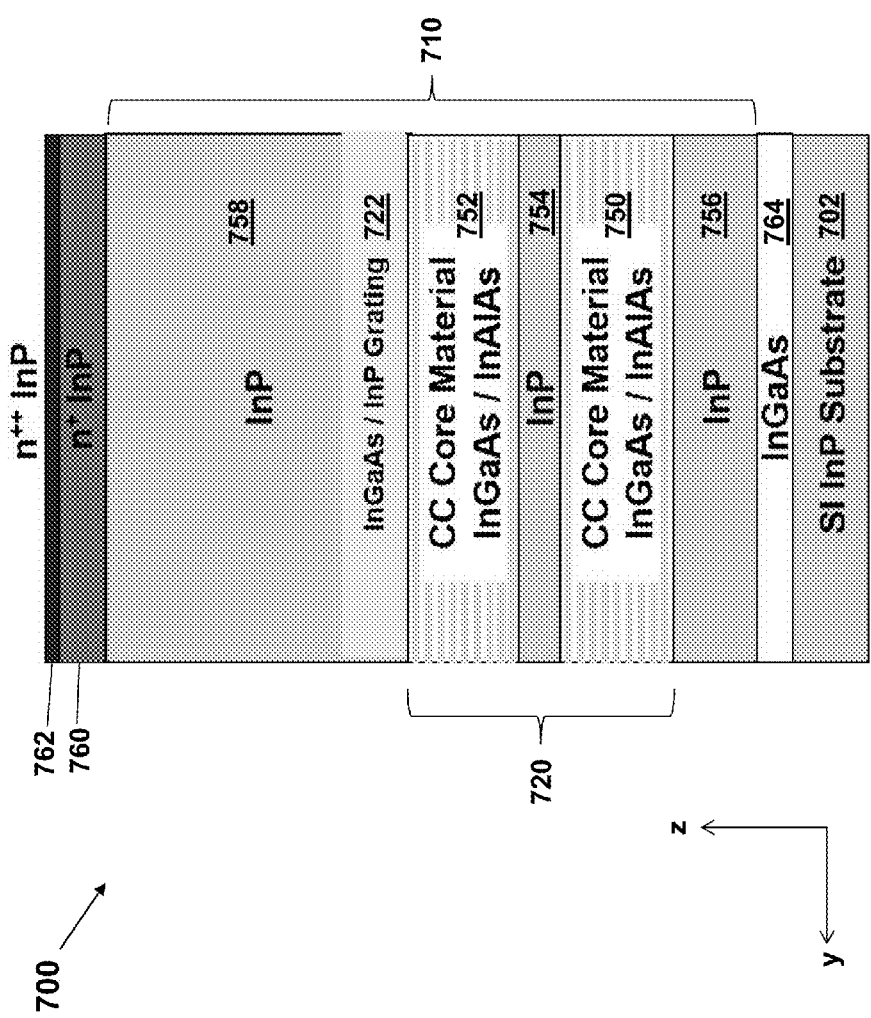
FIG. 7 shows a cross-sectional view of a portion of a terahertz quantum cascade laser device for operation via the Cherenkov DFG scheme according to an illustrative embodiment.

A cross-sectional view of a portion of another illustrative device 700 is shown in FIG. 7. The device 700 includes a substrate 702 (semi-insulating InP) and a waveguide structure 710. The waveguide structure 710 includes a quantum cascade laser structure 720 including a first (lower) core 750 including multiple stages (29), each stage including a first continuum-to-continuum active region and a second (upper) core 752 including multiple stages (29), each stage including a second continuum-to-continuum active region. As noted above, a continuum-to-continuum active region can generate a range of frequencies (including the first and second frequencies $\omega_1$ and $\omega_2$). In the illustrative embodiment, the configurations of the lower core 750 and the upper core 752 are the same (although they need not be) and both generate light including light of the first frequency $\omega_1$ ($\lambda_1$=8.55 µm) and light of the second frequency $\omega_2$ ($\lambda_2$=9.65 µm). Both of the first and second continuum-to-continuum active regions are formed from InGaAs/InAlAs and are configured to exhibit relatively large second-order nonlinear susceptibility for THz DFG. The continuum-to-continuum active regions used were those disclosed in B. Meng, et al., *Appl. Phys. Lett.* 107, 111110 (2015). In this illustrative embodiment, a ~0.3 µm-thick heat-spreading layer 754 separates the upper and lower cores 752, 750.

The device 700 further includes a DFB grating layer 722 above the quantum cascade laser structure 720 which is configured to provide optical feedback for both 8.55 µm and 9.65 µm. The DFB grating layer 722 is configured as the DFB grating layer 522 of FIG. 5, i.e., including a ~0.5 mm gratingless region adjacent to a ~1.5 mm biperiodic binary grating region (total cavity length ~2 mm). The waveguide structure 710 further includes a 2 µm-thick lower cladding layer 756 (doped to ~2×10$^{16}$ cm$^{-3}$) and a ~4 µm-thick upper cladding layer 758 (doped to ~2×10$^{16}$ cm$^{-3}$). The device 700 further includes a ~300 nm-thick plasmon layer 760 (doped to ~3×10$^{18}$ cm$^{-3}$) and a ~10 nm-thick cap layer 762 (doped to ~2×10$^{19}$ cm$^{-3}$). In this illustrative embodiment, the device 700 further includes a ~200 nm-thick current spreading layer 764 (doped to ~10$^{18}$ cm$^{-3}$).

As has been illustrated in FIG. 1A, the front facet of the device 700 includes a high-reflectivity coating of ~100 nm-thick Au outer layer/~200 nm-thick YF$_2$ (or Al$_2$O$_3$) inner layer. The back facet may be uncoated or may include an antireflective coating of YF$_2$ and ZnSe. The substrate 702 is polished to $\theta_{tap}$ ~30°. The exit facet for THz radiation may be uncoated or may include an antireflective (to THz radiation) coating of SiO$_2$. The frequency of laser emission ($\omega_{THz}$) of the device 700 is about 3.7 THz. This illustrative embodiment gives both a large amount of power (due to the large number of stages) and is optimized for minimum THz absorption loss; thus, providing the high values of mid-IR-to-THz conversion efficiency, η(~8 mW/W$^2$ at 3.7 THz). The mid-IR-to-THz conversion efficiencies of the device 600 of FIG. 6 (which is based on bound-to-continuum active regions) is ~1.7 mW/W$^2$.

Figures 11A, 11B:
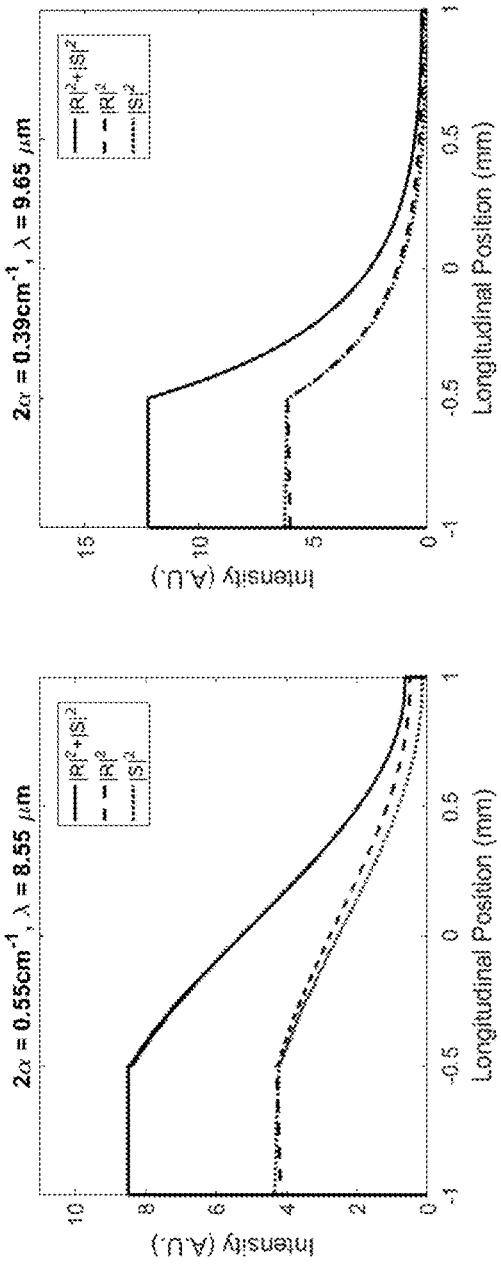
FIG. 11A shows the guided-field intensity profiles for the lowest-loss mode at 8.55 μm wavelength for the device of FIG. 7 having a DFB grating layer including a gratingless region adjacent a biperiodic binary grating region and a front facet coated with a HR coating and an uncoated back facet.
FIG. 11B shows the guided-field intensity profiles for the lowest-loss mode at 9.65 μm wavelength.

FIGS. 11A-11B show the guided-field intensity profiles for $\lambda_1$=8.55 µm (FIG. 11A) and $\lambda_2$=9.65 µm (FIG. 11B) for the device 700. The calculated enhancement in THz extracted power is about 2.8 times that of a comparative device of the same structure but having an uncoated front facet. Furthermore, there is good overlap between 8.55 µm and 9.65 µm S waves over ~1.6 mm away from the front facet, which represents the region over which THz light can be extracted for a 500 µm-thick InP wafer. Thus, virtually all mid-IR light is used for conversion to THz light, and all generated THz light is extracted.

Figures 12A, 12B:
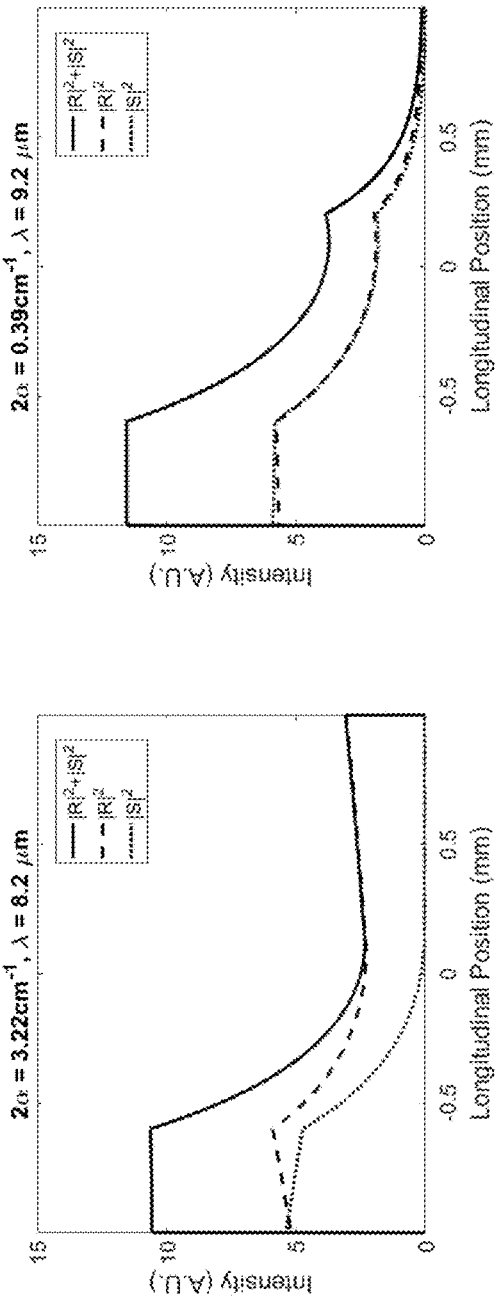
FIG. 12A shows the guided-field intensity profiles for the lowest-loss mode at 8.55 μm wavelength for the device of FIG. 7 having a DFB grating layer including a gratingless region adjacent a biperiodic binary grating region adjacent a $1^{st}$ order grating region for optical feedback at 9.2 μm wavelength light and a front facet coated with a HR coating and an antireflective-coated back facet.
FIG. 12B shows the guided-field intensity profiles for the lowest-loss mode at 9.65 μm wavelength.

FIGS. 12A-12B show the guided-field intensity profiles for $\lambda_1$=8.55 µm (FIG. 12A) and $\lambda_2$=9.65 µm (FIG. 12B) for the device 700 wherein the DFB grating layer 722 is alternatively configured to include a ~0.4 mm gratingless region adjacent to a ~0.8 mm biperiodic binary grating region adjacent to a ~0.8 mm 1$^{st}$-order grating region for which the Bragg condition is satisfied for $\lambda_2$=9.65 µm (total cavity length ~2 mm). This alternatively configured DFB grating layer allows some edge-emission loss at the 8.55 µm wavelength, which increases the threshold-current density value $J_{th}$ at 8.55 µm so it is closer to the $J_{th}$ value at 9.65 µm in a phase-locked array structure (further described below), while still providing most forward-moving power, at both wavelengths, close to the front facet. In addition, an antireflective (AR) coating (1%) on the back facet allows for additional loss at the 8.55 µm wavelength. FIGS. 12A-12B are the results for $\Delta\phi_f$=90° and $\Delta\phi_b$=155°. The S-coupling value is 1.13, while the R-coupling value is only 0.10. That is, THz-radiation extraction is more than an order of magnitude higher when extracted from the front-facet side (left) than if extracted from the back-facet side (right). A 2-D map of the S-coupling as a function of $\Delta\phi_f$ and $\Delta\phi_b$ showed the mean S-coupling value to be 1.13, while the standard deviation in S-coupling was 0.143. Thus, the S-coupling value is fairly constant as the cleaved facets phase shifts vary. If the field is considered to be uniform across the cavity length, the mean S-coupling value is calculated to be only 0.42 (with a standard deviation of 0.01). That is, by employing the illustrative combination of facet coatings and gratings, the extraction efficiency vs. a case with uniform field increases on the average by a factor of 2.7.

Together, FIGS. 8A-8B, 9A-9B, 10A-10B, 11A-11B and 12A-12B demonstrate that, as compared to the conventional approach of using uncoated front facets, the use of the disclosed high-reflectivity coatings on the front facets of the disclosed waveguide structures as well as combined with the disclosed DFB grating layers greatly improves the THz extraction efficiency of the disclosed devices. This, in turn, increases the mid-IR-to-THz conversion efficiency, η, by the same factor, and thus, also increases the average THz power of the disclosed devices.

The disclosed devices may be configured as single-element devices (e.g., as illustrated in FIGS. 1A-1B, 6 and 7). Alternatively, the disclosed devices may be configured as phase-locked array devices in order to increase the volume of mid-IR emitting material, while maintaining coherence across large apertures (e.g., ~100 μm) and thus, to scale the generated THz power. In addition, the THz light generated from a phase-locked array will be a plane wave, given that the emitting aperture is comparable to the THz-radiation wavelength, rather than the conical wave that is being emitted from a single ridge-guide device (see FIG. 1B). In turn, the THz radiation collection efficiency when using a 100 μm-wide phase-locked array is at least twice that when using a single-ridge device, and the collected THz power from an array scales by twice the ratio of array and ridge-guide emitting apertures.

The phase-locked array configuration may be implemented by including in the devices described above, a plurality of laterally-spaced (in the direction of they axis, perpendicular to the xz axes of FIG. 1A) trench regions extending transversely, at least partially into the quantum cascade laser structure (e.g., partially into an upper core, completely through the upper core, completely through the upper core and partially into the heat-spreading layer, etc.) of the waveguide structure. Each trench region may include a lower trench layer including a semi-insulating material and an upper trench layer including a material having a refractive index that is higher than the refractive index of the semi-insulating material. The trench regions define interelement regions separated by element regions in the phase-locked array. The phase-locked array device is characterized in that the effective refractive index of the fundamental transverse mode supported in the interelement regions is higher than the effective refractive index of the fundamental transverse mode supported in the element regions. The phase-locked array device is further characterized in that the device is configured to produce an in-phase array mode meeting the lateral resonance condition in which there is strong coupling via leaky waves between all of the element regions. In other words, the array elements are coupled via resonant leaky-wave coupling in what constitutes a high-index-contrast (HC) photonic-crystal (PC) structure. Phase-locked array devices including quantum cascade laser structures are described in U.S. Pat. Nos. 8,259,767 and 8,428,093, each of which is hereby incorporated by reference in its entirety.

Figure 13A:
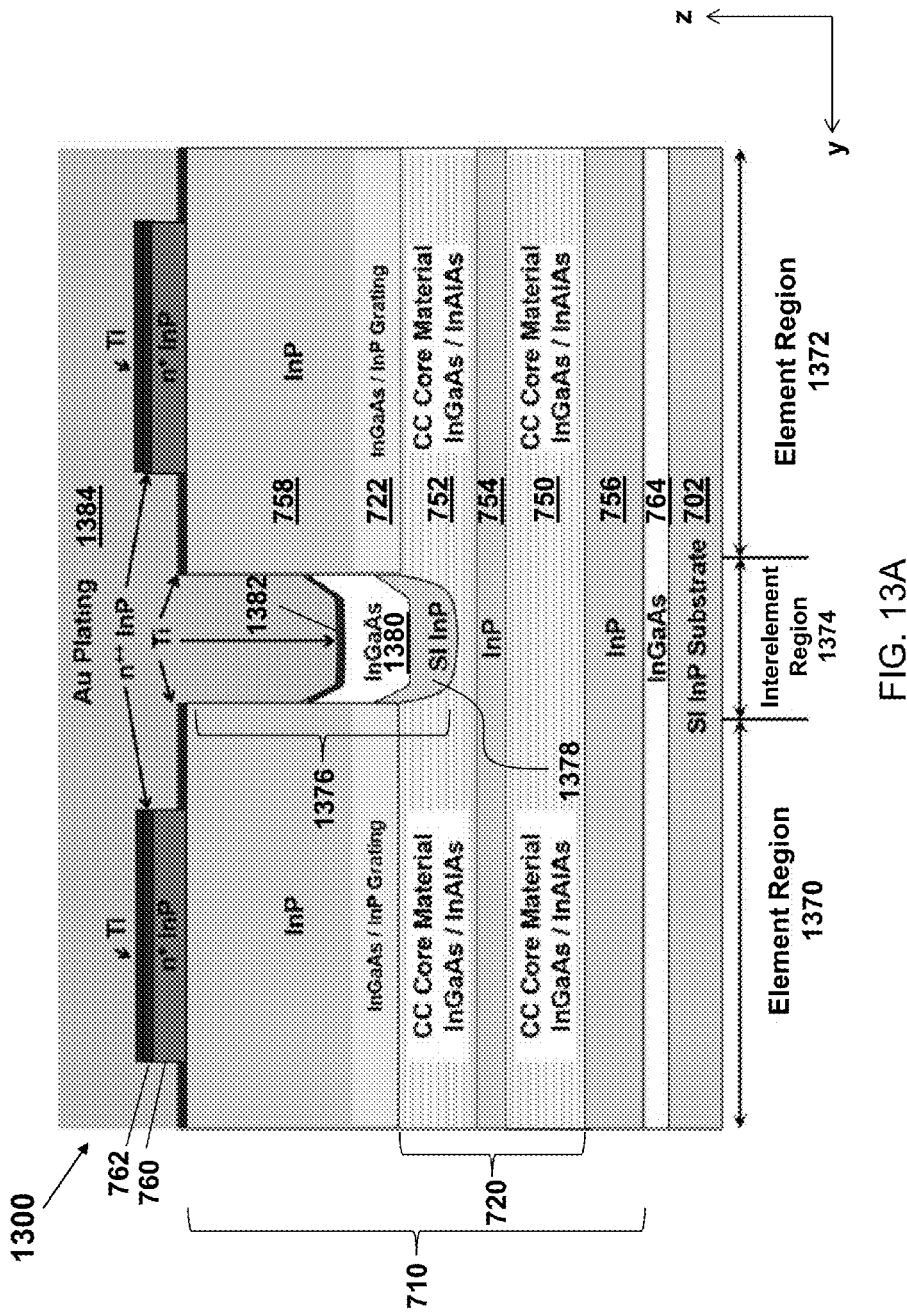
FIG. 13A shows a cross-sectional view of a portion of a terahertz quantum cascade laser phase-locked array device for operation via the Cherenkov DFG scheme according to an illustrative embodiment.

A cross-sectional view of a portion of a phase-locked array device 1300 is shown in FIG. 13A. Two element regions 1370, 1372 are separated by an interelement region 1374 defined by a trench region 1376. Aside from the inclusion a plurality of trench regions and additional material layers formed in and over the plurality of trench regions, the multilayer structure of the device 1300 is the same as that of the single-element device 700 shown in FIG. 7. Thus, the same reference labels are used as described above. However, other quantum cascade laser structures and other DFB grating layers may be used as described above. In addition, additional, fewer, or different material layers may be included in the multilayer structure as described above. In this illustrative embodiment, the trench region 1376 extends partially into the upper core 752 of the quantum cascade laser structure 720 (and thus, partially into the waveguide structure 710). The trench region 1376 includes a lower trench layer 1378 of a semi-insulating material (e.g., semi-insulating InP) and an upper trench layer 1380 of a material of a higher refractive index (e.g., InGaAs) than the semi-insulating material. Additional material layers may be formed in the trench regions as well as over the rest of the multilayer structure, e.g., a layer of a light-absorbing material 1382 (e.g., Ti) and a layer of metal 1384 (e.g., Au). The phase-locked array device 1300 is otherwise configured as described above with respect to device 100 of FIG. 1A, i.e., including a high-reflectivity coating on the front facet and a beveled substrate 702. The back facet and the exit facet may be uncoated or one or both may be coated with an antireflective coating as described above.

Figure 13B:
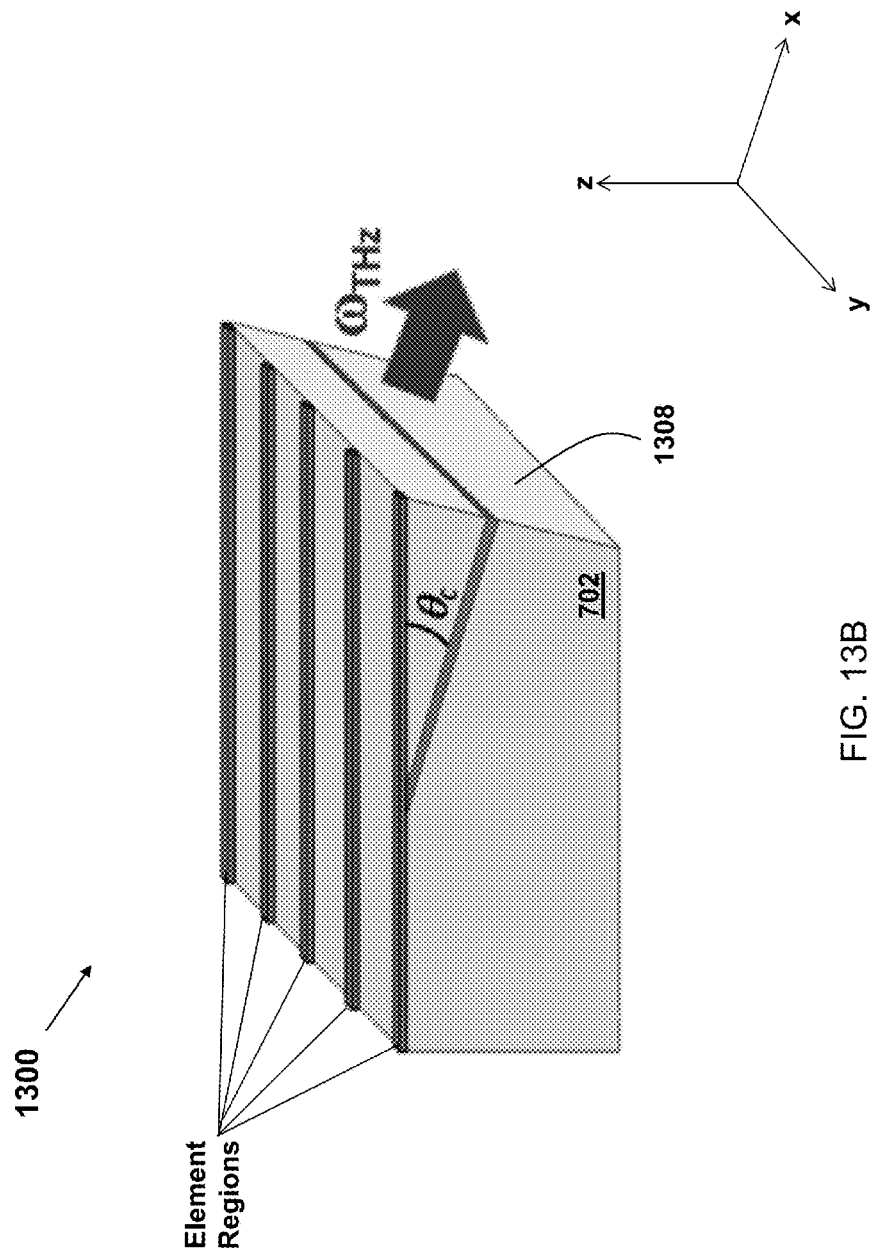
FIG. 13B shows a perspective view of the device of FIG. 13A.

A perspective view of the phase-locked array device 1300 is shown in FIG. 13B. The phase-locked array device 1300 is shown processed similarly to the device 100 of FIG. 1B. The number of element regions, the number of interelement regions, and their respective widths may vary. FIG. 13B shows 5 element regions, each about 15 μm wide. The total width of the device 1300 is about 100 μm. The exit facet 1308 and substrate 702 are labeled. The generated THz power from the device 1300 will increase fivefold compared to a comparative 15 μm-wide ridge device (i.e., single-element device). Furthermore, as shown in FIG. 13B, the THz light generated from the device 1300 will be a plane wave, given that the emitting aperture is comparable to the THz-radiation wavelength, rather than the conical wave that is being emitted from a single ridge-guide device (see FIG. 1B). It has been calculated that the THz radiation collection efficiency when using a 100 μm-wide phase-locked array such as that of FIG. 13B is at least twice that when using a single-ridge device. Thus, using a phase-locked array increases the usable THz-radiation output by at least an order of magnitude.

Fabrication of the phase-locked array device 1300 first follows that described above with respect to the formation of the multilayer structure of the single-element devices. Next, the interelement regions may be formed by etch-and-regrowth as described in J. D. Kirch, C.-C Chang, C. Boyle et al, *Appl. Phys. Lett.* 106, 061113 (2015), which is hereby incorporated by reference in its entirety. The interelement regions may then be proton-implanted in order to confine the current only to the element regions. After implantation, additional processing follows that described in J. D. Kirch, C.-C Chang, C. Boyle et al, *Appl. Phys. Lett.* 106, 061113 (2015), resulting in devices having the cross-section shown in FIG. 13A. Additional processing steps, e.g., cleaving, facet coating, substrate polishing, etc., may then be conducted as described above to complete the devices.

Figure 14:
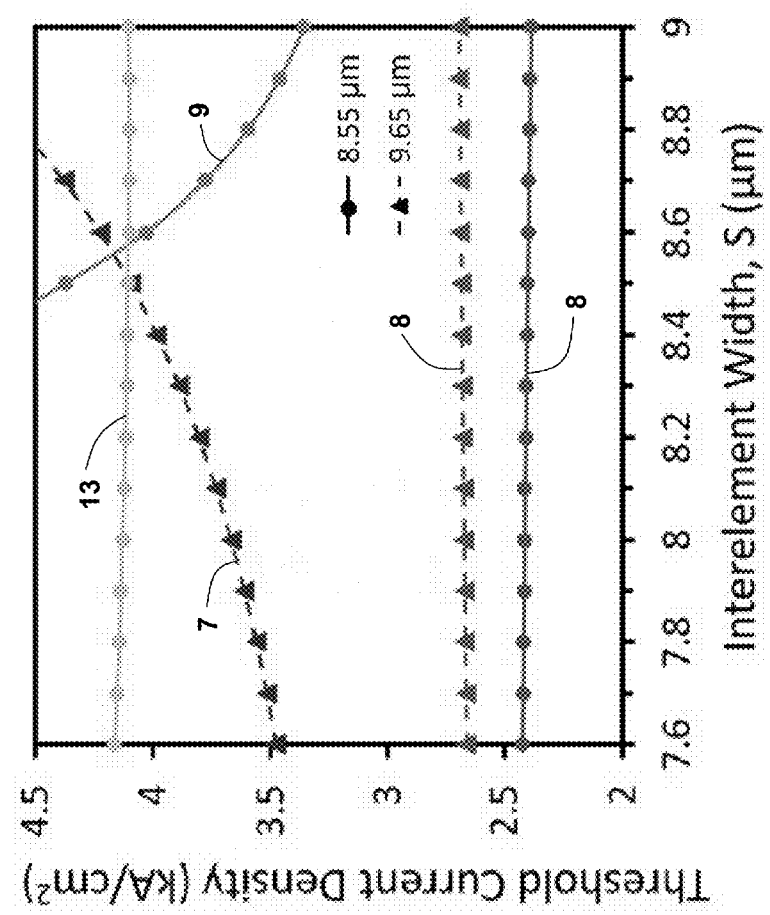
FIG. 14 plots the threshold-current density $J_{th}$ as a function of interelement width S for the device of FIG. 13A having 5 element regions. The DFB grating layer used was that used in FIGS. 12A, 12B; i.e., including a gratingless region, a biperiodic binary grating region, and a $1^{st}$-order grating region.
Figure 15:
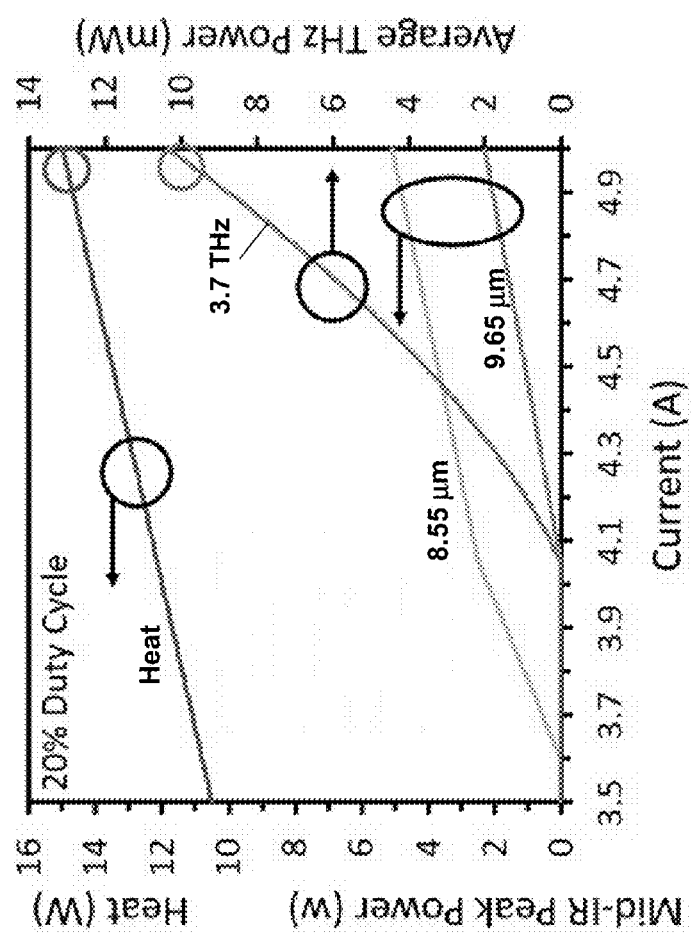
FIG. 15 plots the internal peak mid-IR power as a function of drive current at 8.55 μm and 9.65 μm wavelengths, respectively the average THz power and the dissipated heat power at a duty cycle of 20% (considering a voltage of 15 V) for the device of FIG. 13A.

FIG. 14 plots the threshold-current density $J_{th}$ as a function of interelement width S for the device 1300 of FIG. 13A having 5 element regions and continuum-to-continuum active regions within the stages of the quantum cascade laser structure 720. The DFB grating layer 722 used was that used in FIGS. 12A, 12B; i.e., including a 0.4 mm gratingless region, a 0.8 mm biperiodic binary grating region for optical feedback at 8.55 µm and 9.65 µm wavelengths, and a 0.8 mm 1$^{st}$-order grating region for optical feedback at 9.65 µm wavelength (total cavity length ~2 mm). The front facet was coated with a high-reflectivity coating and the back facet was coated with an antireflective coating. The frequency of laser emission ($\omega_{THz}$) of the device 1300 is about 3.7 THz. As shown in FIG. 14, the in-phase-mode $J_{th}$ values are ~2.4 kA/cm$^2$ for 8.55 µm lasing and ~2.68 kA/cm$^2$ for 9.65 µm lasing. The structure has the same high built-in index step, Δn, value: 0.06, between interelement and element regions, at λ=8.55 µm and =9.65 µm. Mode 8 is strongly favored to lase over a 0.6 µm-wide region in S (i.e., from 8.1 µm to 8.7 µm); in that, over that range the $J_{th}$ values of the competing modes, adjacent array modes 7 and 9, are ≥40% higher than the $J_{th}$ value for mode 8. FIG. 15 plots the internal peak mid-IR power as a function of drive current at 8.55 µm and 9.65 µm, respectively, the average THz power and the dissipated heat power at a duty cycle of 20% (considering a voltage of 15 V). As FIG. 15 shows, 10 mW average 3.7 THz power can be achieved at ~5 A drive current. The dissipated heat is ~15.5 W, which can be effectively removed at room temperature by employing standard thermoelectric (TE) coolers.

Figure 16:
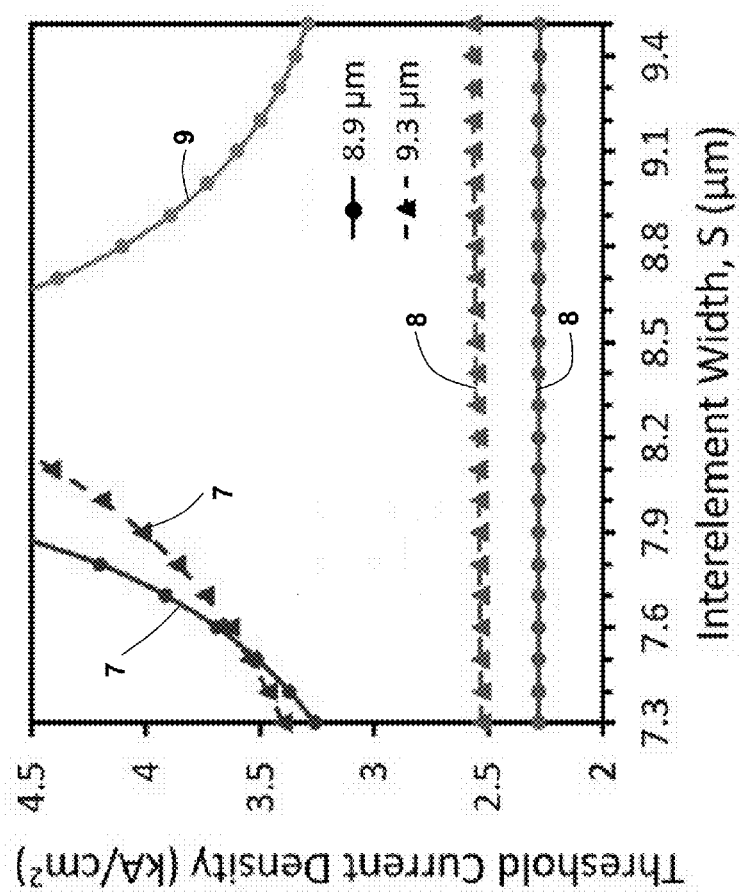
FIG. 16 plots the threshold-current density $J_{th}$ as a function of interelement width S for the device of FIG. 13A having 5 element regions. The DFB grating layer used was similar to that used in FIGS. 11A, 11B; i.e., including a gratingless region and a biperiodic binary grating region. However, the biperiodic binary grating region was configured for optical feedback at 8.9 μm and 9.3 μm, in order to provide 1.5 THz radiation via DFG.

FIG. 16 plots the threshold-current density $J_{th}$ as a function of interelement width S for the device 1300 of FIG. 13A having 5 element regions and continuum-to-continuum active regions within the stages of the quantum cascade laser structure 720. The DFB grating layer 722 used was similar to that used in FIGS. 11A, 11B; i.e., including a 0.5 mm gratingless region and a 1.5 mm biperiodic binary grating region. However, the biperiodic binary grating region was configured for optical feedback at 8.9 µm and 9.3 µm wavelengths, in order to provide 1.5 THz radiation via DFG (total cavity length ~2 mm). The front facet was coated with a high-reflectivity coating and the back facet was uncoated. A 2-D map of the S-coupling as a function of Δϕ$_f$ and Δϕ$_b$ showed that the mean S-coupling value is 1.69, while the standard deviation in S-coupling is 0.23. Thus, the S-coupling value is fairly constant as the cleaved facets phase shifts vary. If the field is considered to be uniform across the cavity length, the mean S-coupling value is calculated to be only 0.73 (with a standard deviation of 0.01). That is, by employing the illustrative combination of facet coatings and gratings, the extraction efficiency vs. a case with uniform field increases on the average by a factor of 2.31.

As shown in FIG. 16, the in-phase-mode $J_{th}$ values are ~2.55 kA/cm$^2$ and ~2.3 kA/cm$^2$ at 9.3 µm and 8.9 µm wavelengths, respectively. The structure has the same high built-in index step, Δn, value: 0.06, between interelement and element regions, at λ=8.9 µm and 9.3 µm wavelengths. Mode 8 is strongly favored to lase over a 1.60 µm-wide region in S (i.e., from 7.5 µm to 9.1 µm); in that, over that range the $J_{th}$ values of the competing modes, array modes 7 and 9, are ≥40% higher than the mode-8 $J_{th}$ value. Thus, while for 1.5 THz vs. 3.7 THz one obtains a lower mid-IR-to-THz conversion efficiency, the fabrication tolerance for obtaining stable, in-phase array-mode operation is 2.7 times larger than that needed to at 3.7 THz frequency. (The fabrication-tolerance window is inversely proportional with the needed wavelength difference.) Indeed the ratio of the wavelength differences needed for generating 3.7 and 1.5 THz is 1.1 µm/0.4 µm=2.75; basically the 2.7 ratio mentioned above.

Figure 17:
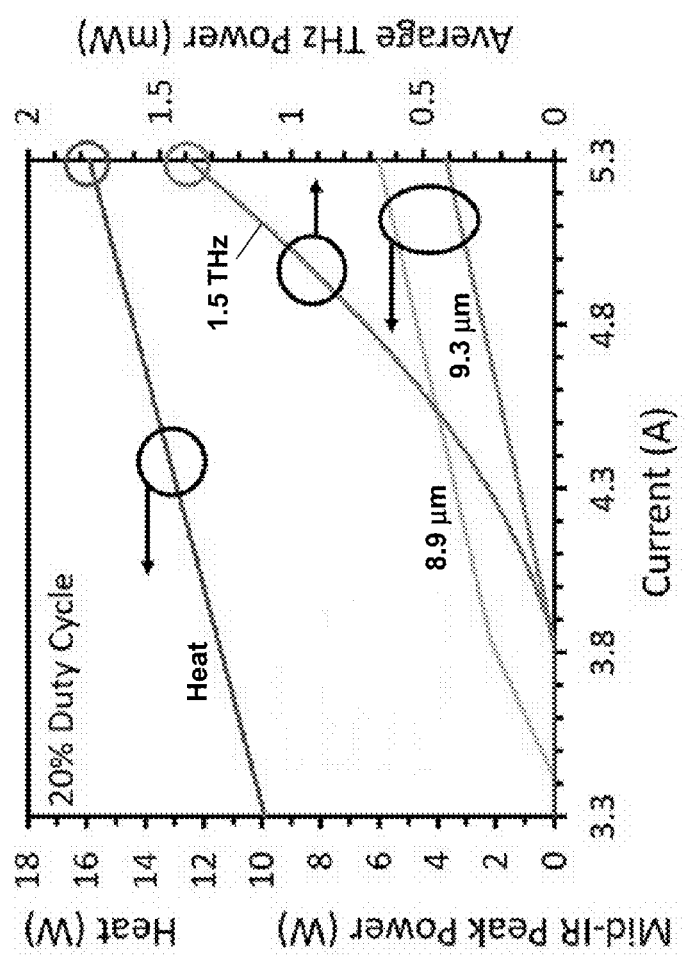
FIG. 17 plots the internal peak mid-IR power as a function of drive current at 8.9 μm and 9.3 μm wavelengths, respectively, the average THz power and the dissipated heat power at a duty cycle of 20% (considering a voltage of 15 V).

FIG. 17 plots the internal peak mid-IR power as a function of drive current at 8.9 µm and 9.3 µm wavelengths, respectively; the average THz power and the dissipated heat power at a duty cycle of 20% (considering a voltage of 15 V). As can be seen, 1.4 mW average 1.5 THz power can be achieved at 5.3 A drive current. The dissipated heat is 15.9 W, which can be removed at room temperature by employing standard TE coolers.

Together, FIGS. 14-17 show that the disclosed phase-locked array devices provide significantly higher powers at room temperature as compared to conventional Cherenkov THz DFG-QCLs. (See Background.) As described above, this is attributed, at least in part, to the use of the disclosed high-reflectivity coatings on the front facets of the disclosed waveguide structures as well as in combination with the disclosed DFB grating layers. Further increases in power (e.g., ~50 mW average THz power at 3-4 THz at room temperature) may be achieved by increasing the cavity length (e.g., to ~5 mm) and by transferring and bonding the devices to high-resistivity Si substrates which have significantly lower loss at 3-4 THz as compared to semi-insulating InP.

Figure 18:
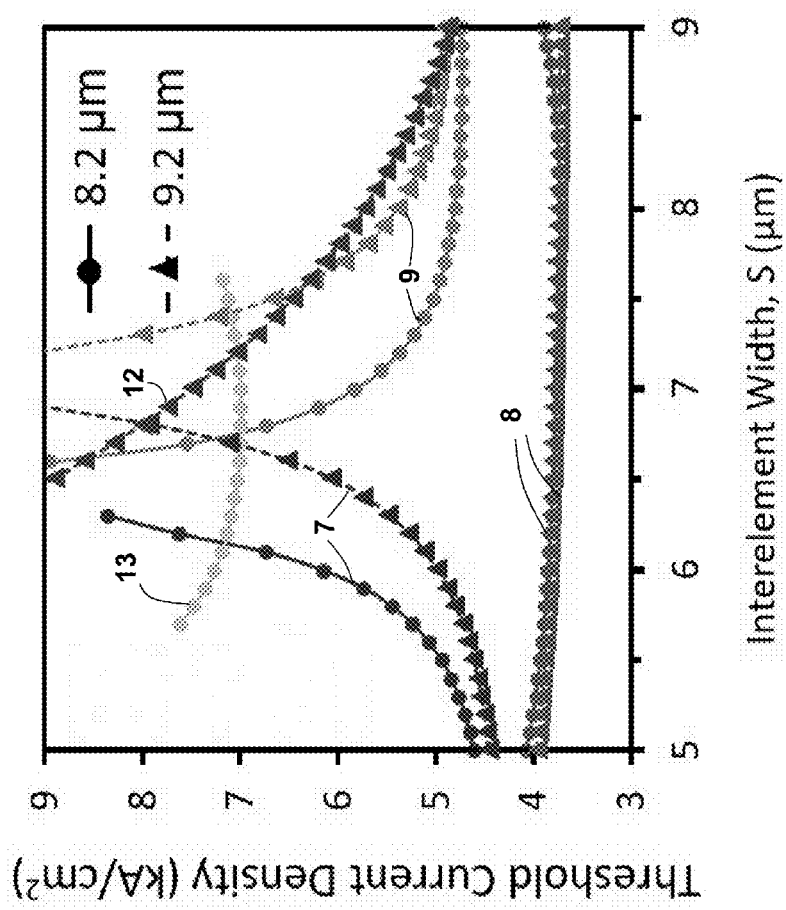
FIG. 18 plots the threshold-current density $J_{th}$ as a function of interelement width S for a phase-locked array device having 5 element regions, the device based on the multilayer structure of FIG. 6. The DFB grating layer of the device used was that used in FIGS. 10A, 10B; i.e., including two back-to-back $1^{st}$-order grating regions.

By way of another illustration, another phase-locked array device having a structure similar to the phase-locked array device 1300 of FIG. 13A may be formed, but based on the multilayer structure of FIG. 6 (i.e., just as the phase-locked array device 1300 of FIG. 13A is based on the multilayer structure of FIG. 7). FIG. 18 plots the threshold-current density $J_{th}$ as a function of interelement width S for such a device having 5 element regions and multiple stages including a first bound-to-continuum active region and multiple stages including a second bound-to-continuum active region in the cores 650, 652 of the quantum cascade laser structure 620, respectively. The DFB grating layer 622 used was similar to that used in FIGS. 10A, 10B; i.e., two back-to-back 1$^{st}$-order grating regions for optical feedback at 8.2 µm and 9.2 µm wavelengths, respectively (see also the DFB grating layer 422 of FIG. 4). The front facet was coated with a high-reflectivity coating and the back facet was uncoated. The phase-locked array device has a high built-in index step, Δn, values between interelement and element regions, at both λ=8.2 µm (Δn=0.093) and λ=9.2 µm (Δn=0.081). The mode-8 $J_h$ value is ~3.8 kA/cm$^2$ and is about the same at both wavelengths.

Unless otherwise indicated, the semiconductor materials disclosed herein may be doped or undoped.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A terahertz quantum cascade laser device comprising:
   a substrate having a top substrate surface, a bottom substrate surface, and an exit facet extending between the top substrate surface and the bottom substrate surface at an angle $\theta_{tap}$ relative to normal to the top substrate surface;
   a waveguide structure above the top substrate surface, the waveguide structure having a top surface, a bottom surface, a front facet extending between the top surface and the bottom surface and positioned proximate to the exit facet of the substrate, and a back facet extending between the top surface and the bottom surface and oppositely facing the front facet, the waveguide structure comprising
      a quantum cascade laser structure comprising a superlattice of quantum wells and barriers, the quantum cascade laser structure configured to generate light comprising light of a first frequency $\omega_1$, light of a second frequency $\omega_2$, and light of a third frequency $\omega_{THz}$, wherein $\omega_{THz}=\omega_1-\omega_2$,
      an upper cladding layer above the quantum cascade laser structure, and
      a lower cladding layer below the quantum cascade laser structure;
   a distributed feedback (DFB) grating layer above the quantum cascade laser structure, the DFB grating layer comprising one or more grating regions, each grating region comprising grating elements which periodically alternate in a longitudinal direction across the device, wherein adjacent grating elements have different indices of refraction, the DFB grating layer configured to provide optical feedback for one or both of the light of the first frequency $\omega_1$ and the light of the second frequency $\omega_2$ and to produce lasing at one or both of the first frequency $\omega_1$ and the second frequency $\omega_2$, thereby resulting in laser emission at the third frequency $\omega_{THz}$ at a Cherenkov angle $\theta_{THz}$ through the bottom surface of the waveguide structure into the substrate and exiting the substrate through the exit facet; and
   a high-reflectivity coating on the front facet of the waveguide structure.

2. The device of claim 1, wherein the back facet is uncoated or coated with an antireflective coating.

3. The device of claim 1, wherein the quantum cascade laser structure comprises a first core comprising multiple stages, each stage comprising a first bound-to-continuum heterostructure configured to generate the light of the first frequency $\omega_1$ and a second core comprising multiple stages, each stage comprising a second bound-to-continuum heterostructure configured to generate the light of the second frequency $\omega_2$.

4. The device of claim 1, wherein the quantum cascade laser structure comprises one or more cores comprising multiple stages, each stage comprising a continuum-to-continuum heterostructure configured to generate the light of the first frequency $\omega_1$ and the light of the second frequency $\omega_2$.

5. The device of claim 4, wherein the quantum cascade laser structure comprises two cores, each comprising multiple stages, each stage comprising the continuum-to-continuum heterostructure.

6. The device of claim 1, wherein the quantum cascade laser structure comprises InGaAs/InAlAs heterostructures.

7. The device of claim 1, wherein the DFB grating layer is configured to provide optical feedback for only one of the light of the first frequency $\omega_1$ and the light of the second frequency $\omega_2$ and to produce lasing at only one of the first frequency $\omega_1$ and the second frequency $\omega_2$.

8. The device of claim 1, wherein the DFB grating layer is a buried DFB grating layer.

9. The device of claim 1, wherein at least one of the grating regions is characterized by a periodicity $\Lambda=m\lambda/(2n_{\mathit{eff}})$, where m is the grating order, $\lambda$ is the wavelength corresponding to the light of the first frequency $\omega_1$ or the light of the second frequency $\omega_2$ and $n_{\mathit{eff}}$ is the effective index of refraction of the quantum cascade laser structure for $\lambda$.

10. The device of claim 9, wherein the DFB grating layer comprises a single grating region characterized by the periodicity $\Lambda$ such that the DFB grating layer provides optical feedback for only one of the light of the first frequency $\omega_1$ and the light of the second frequency $\omega_2$ to produce lasing at only one of the first frequency $\omega_1$ and the second frequency $\omega_2$.

11. The device of claim 9, wherein the DFB grating layer comprises two grating regions, wherein one of the grating regions is characterized by a first periodicity $\Lambda_1$ and a length $l_1$, and the other of the grating regions is characterized by a second periodicity $\Lambda_2$ and a length $l_2$.

12. The device of claim 11, wherein the sum of $l_1$ and $l_2$ is substantially the same as the length of the waveguide structure.

13. The device of claim 1, wherein at least one of the grating regions is a biperiodic binary grating region.

14. The device of claim 13, wherein the length of the biperiodic binary grating region is substantially the same as the length of the waveguide structure.

15. The device of claim 1, wherein the length of the one or more grating regions is selected to define at least one gratingless region in the DFB grating layer.

16. The device of claim 15, wherein the DFB grating layer comprises a gratingless region and a single grating region which is a biperiodic binary grating region.

17. The device of claim 16, wherein the back facet is uncoated.

18. The device of claim 15, wherein the DFB grating layer comprises a gratingless region, a biperiodic binary grating region, and a grating region characterized by a periodicity $\Lambda=m\lambda/(2n_{\mathit{eff}})$, where m is the grating order, $\lambda$ is the wavelength corresponding to the light of the first frequency $\omega_1$ or the light of the second frequency $\omega_2$ and $n_{\mathit{eff}}$ is the effective index of refraction of the quantum cascade laser structure for $\lambda$.

19. The device of claim 15, wherein the back facet is coated with an antireflective coating.

20. The device of claim 1, wherein the device is configured as a phase-locked array comprising a plurality of laterally-spaced trench regions extending transversely, at least partially into the quantum cascade laser structure, each trench region comprising a lower trench layer comprising a semi-insulating material and an upper trench layer comprising a material having a refractive index that is higher than the refractive index of the semi-insulating material, wherein the trench regions define interelement regions separated by element regions in the array,
   wherein the device is characterized in that the effective refractive index of the fundamental transverse mode supported in the interelement regions is higher than the effective refractive index of the fundamental transverse mode supported in the element regions, and further characterized in that the device is configured to produce an in-phase array mode meeting the lateral resonance condition in which there is strong coupling via leaky waves between all of the element regions in the array.

* * * * *

UNITED STATES PATENT AND TRADEMARK OFFICE
CERTIFICATE OF CORRECTION

PATENT NO. : 9,742,151 B1  
APPLICATION NO. : 15/145951  
DATED : August 22, 2017  
INVENTOR(S) : Dan Botez et al.

Page 1 of 2

It is certified that error appears in the above-identified patent and that said Letters Patent is hereby corrected as shown below:

On the Title Page

Item (57) Abstract, Line 5:
Delete "angle $\theta_{tap}$" and replace with --angle $\theta_{lap}$--

In the Specification

Column 2, Line 13:
Delete "angle $\theta_{tap}$" and replace with --angle $\theta_{lap}$--

Column 4, Line 57:
Delete "$\theta_{tap}$ relative" and replace with --$\theta_{lap}$ relative--

Column 5, Line 55:
Delete "$\theta_{tap}$ relative" and replace with --$\theta_{lap}$ relative--

Column 5, Line 56:
Delete "$\theta_{tap}$ may" and replace with --$\theta_{lap}$ may--

Column 5, Line 61:
Delete "angle $\theta_{tap}$" and replace with --angle $\theta_{lap}$--

Column 5, Line 62:
Delete "angle $\theta_{tap}$" and replace with --angle $\theta_{lap}$--

Column 6, Line 10:
Delete "they axis" and replace with --the y axis--

Signed and Sealed this  
Fourth Day of September, 2018

Andrei Iancu  
*Director of the United States Patent and Trademark Office*

CERTIFICATE OF CORRECTION (continued)
U.S. Pat. No. 9,742,151 B1

Column 6, Line 19:
Delete "angle $\theta_{tap}$" and replace with --angle $\theta_{lap}$--

Column 12, Line 61:
Delete "$\theta_{tap}$, by" and replace with --$\theta_{lap}$, by--

Column 12, Line 62:
Delete "$z_{max} = t_{sub}(tan\theta_{tap} + cot\theta_{THz})$" and replace with --$z_{max} = t_{sub}(tan\theta_{lap} + cot\theta_{THz})$--

Column 14, Line 21:
Delete "polished to $\theta_{tap}$" and replace with --polished to $\theta_{lap}$--

Column 15, Line 35:
Delete "they axis" and replace with --the y axis--

In the Claims

Column 19, Line 6, Claim 1:
Delete "angle $\theta_{tap}$" and replace with --angle $\theta_{lap}$--